(12) United States Patent
Fujimori et al.

(10) Patent No.: US 10,263,150 B2
(45) Date of Patent: Apr. 16, 2019

(54) SEMICONDUCTOR LIGHT EMITTING DEVICE CAPABLE OF INCREASING LUMINOUS EFFICIENCY UNDER A LOW APPLIED CURRENT

(71) Applicant: ROHM CO., LTD., Kyoto (JP)

(72) Inventors: Takao Fujimori, Kyoto (JP); Kazuaki Tsutsumi, Kyoto (JP); Hirotaka Obuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 185 days.

(21) Appl. No.: 15/586,613

(22) Filed: May 4, 2017

(65) Prior Publication Data

US 2017/0331004 A1 Nov. 16, 2017

(30) Foreign Application Priority Data

May 10, 2016 (JP) .................................. 2016-094837
May 26, 2016 (JP) .................................. 2016-105573
Apr. 27, 2017 (JP) .................................. 2017-088714

(51) Int. Cl.
*H01L 33/24* (2010.01)
*H01L 33/62* (2010.01)
*H01L 33/38* (2010.01)
*H01L 33/46* (2010.01)

(52) U.S. Cl.
CPC ............ *H01L 33/24* (2013.01); *H01L 33/385* (2013.01); *H01L 33/46* (2013.01); *H01L 33/62* (2013.01)

(58) Field of Classification Search
CPC ....... H01L 33/24; H01L 33/20; H01L 33/382; H01L 33/385; H01L 33/38; H01L 33/46; H01L 33/62
See application file for complete search history.

(56) References Cited

U.S. PATENT DOCUMENTS

| | | | | |
|---|---|---|---|---|
| 5,070,510 A | * | 12/1991 | Konushi | ............ H01L 33/0062 257/E21.123 |
| 8,319,250 B2 | * | 11/2012 | Rode | ..................... H01L 25/167 257/99 |
| 9,076,941 B2 | * | 7/2015 | Herrmann | ........... H01L 33/0079 |
| 9,368,687 B2 | * | 6/2016 | Uemura | .................. H01L 33/10 |

(Continued)

FOREIGN PATENT DOCUMENTS

| | | |
|---|---|---|
| JP | 2006-339550 A | 12/2006 |
| JP | 2012-195602 A | 10/2012 |

(Continued)

*Primary Examiner* — Andrew Q Tran
(74) *Attorney, Agent, or Firm* — Rabin & Berdo, P.C.

(57) ABSTRACT

A semiconductor light emitting device includes a substrate having a first major surface and a second major surface, a semiconductor layer that includes a first semiconductor layer of a first conductive type formed on the first major surface of the substrate, a light emitting layer formed on the first semiconductor layer and a second semiconductor layer of a second conductive type formed on the light emitting layer, and a mesa structure formed in the semiconductor layer by selectively notching the first semiconductor layer, the light emitting layer and the second semiconductor layer so as to expose the first semiconductor layer, and a ratio of a luminescent area of the light emitting Layer with respect to an area of the first major surface of the substrate being set to equal to or smaller than 0.25.

41 Claims, 17 Drawing Sheets

(56) References Cited

U.S. PATENT DOCUMENTS

2011/0272728 A1 11/2011 Rode et al.
2014/0051194 A1 2/2014 Herrmann et al.
2014/0231853 A1 8/2014 Uemura

FOREIGN PATENT DOCUMENTS

JP 2015-012144 A 1/2015
JP 2015-173294 A 10/2015

* cited by examiner

XIV-XIV

XV-XV

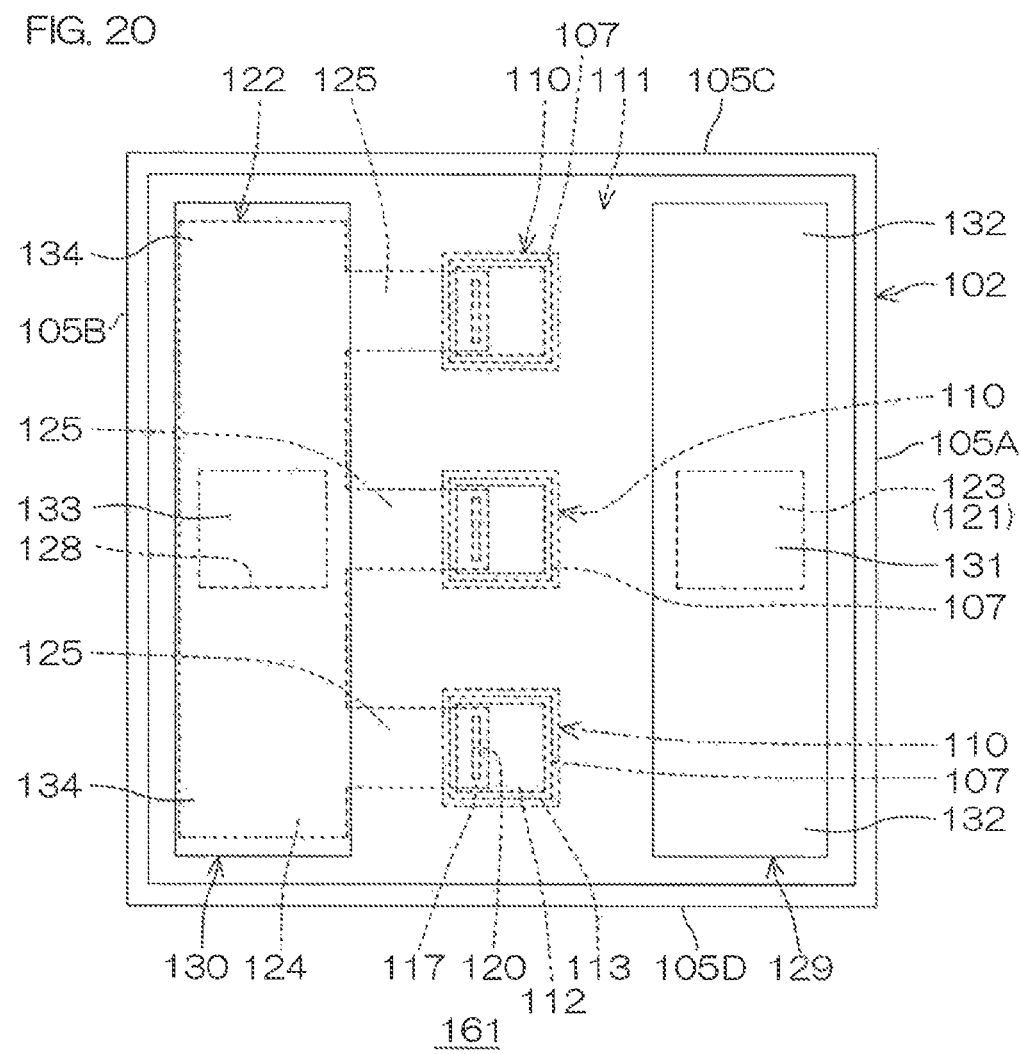

SEMICONDUCTOR LIGHT EMITTING DEVICE CAPABLE OF INCREASING LUMINOUS EFFICIENCY UNDER A LOW APPLIED CURRENT

BACKGROUND OF THE INVENTION

1. Field of the Invention

The present invention relates to a semiconductor light emitting device.

2. Description of the Related Art

A light emitting device including a substrate and a semiconductor layer formed on the substrate is disclosed in FIG. 2 of JP2015-12144. The semiconductor layer includes an n-type semiconductor layer laminated on the substrate, an active layer (a light emitting layer) laminated on the n-type semiconductor layer, and a p-type semiconductor layer laminated on the active layer.

SUMMARY OF THE INVENTION

A preferred embodiment of the present invention provides a semiconductor light emitting device including a substrate having a first major surface and a second major surface, a semiconductor layer that includes a first semiconductor layer of a first conductive type formed on the first major surface of the substrate, a light emitting layer formed on the first semiconductor layer and a second semiconductor layer of a second conductive type formed on the light emitting layer, and a mesa structure formed in the semiconductor layer by selectively notching the first semiconductor layer, the light emitting layer and the second semiconductor layer so as to expose the first semiconductor layer, and a ratio of a luminescent area of the light emitting layer with respect to an area of the first major surface of the substrate being set to equal to or smaller than 0.25.

The aforementioned and other objects, features, and effects of the present invention will be made clear by the following description of the preferred embodiments with reference to the attached drawings.

BRIEF DESCRIPTION OF THE DRAWINGS

FIG. 4 is a plan view of a first embodiment example of a mesa structure of the semiconductor light emitting device shown in FIG. 1, where a first embodiment example of a first contact electrode film is shown together with.

FIG. 20 is a plan view of a semiconductor light emitting device according to a fourth preferred embodiment of the present invention.

DETAILED DESCRIPTION OF THE PREFERRED EMBODIMENT

In a semiconductor light emitting device, a suitable rated current according to specifications thereof is generally applied. However, a current lower than the rated current may be applied to the semiconductor light emitting devices in some cases, in accordance with the diversification of scenes where the semiconductor light emitting device is used. In such cases, a current flowing inside a light emitting layer is decreased, and the luminous efficiency is therefore lowered.

Inventors of the present application have confirmed that such problems are remarkably observed particularly in a semiconductor light emitting device having a structure designed such that a light emitting area of the light emitting layer is substantially equal to an area of a surface of a substrate.

That is, in a semiconductor light emitting device having such a structure, a density of current flowing through the light emitting layer is reduced because a current flowing through the semiconductor layer flows into the light emitting layer so as to be dispersed in a relatively wide region. The luminous efficiency is thereby lowered.

A preferred embodiment of the present invention therefore provides a semiconductor light emitting device capable of increasing luminous efficiency.

A semiconductor light emitting device according to a preferred embodiment of the present invention includes a substrate having a first major surface and a second major surface, a semiconductor layer that includes a first semiconductor layer of a first conductive type formed on the first major surface of the substrate, a light emitting layer formed on the first semiconductor layer and a second semiconductor layer of a second conductive type formed on the light emitting layer, and a mesa structure formed in the semiconductor layer by selectively notching the first semiconductor layer, the light emitting layer and the second semiconductor layer so as to expose the first semiconductor layer, and a ratio of a luminescent area of the light emitting layer with respect to an area of the first major surface of the substrate being set to equal to or smaller than 0.25.

According to the semiconductor light emitting device, the ratio of the luminescent area of the light emitting layer with respect to the area of the first major surface of the substrate is equal to or smaller than 0.25. According to this structure, the light emitting layer functions as a current confinement portion that narrows a current channel. A reduction in a current density of the light emitting layer can thus be suppressed. The semiconductor light emitting device capable of increasing luminous efficiency can thereby be provided.

A preferred embodiment of the present invention will now be explained in detail with reference to the accompanying drawings.

Figure 1:
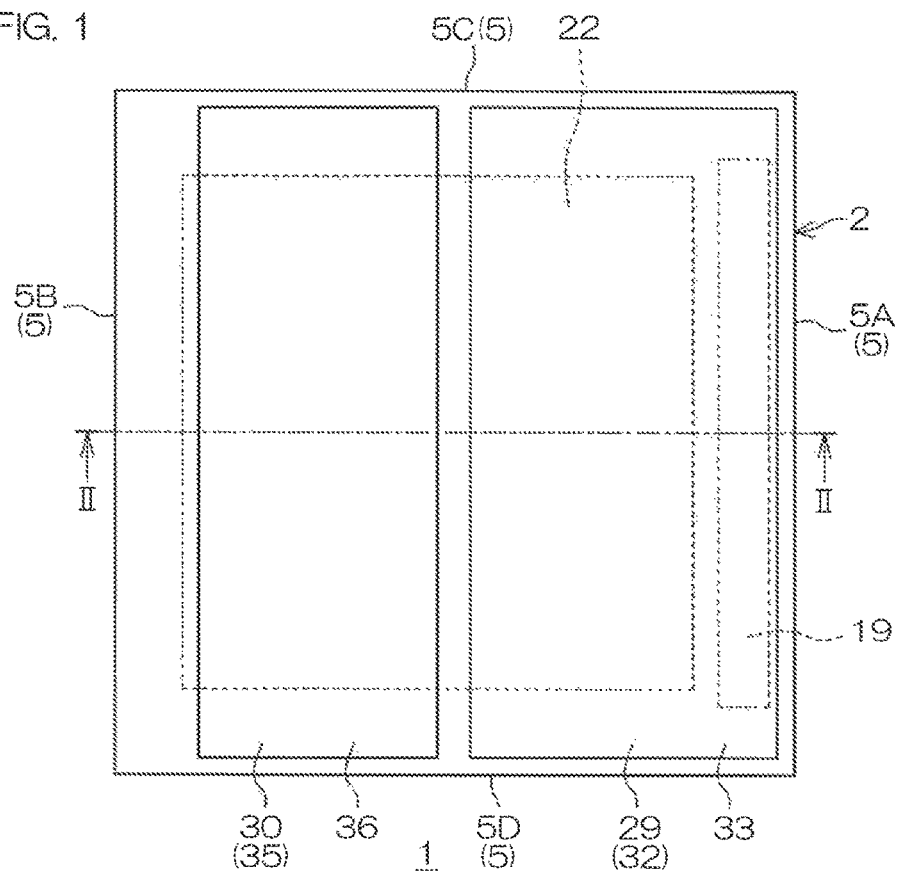
FIG. 1 is a plan view of a semiconductor light emitting device according to a first preferred embodiment of the present invention.

FIG. 1 is a plan view of a semiconductor light emitting device 1 according to a first preferred embodiment of the present invention.

A semiconductor light emitting device is generally controlled by an operating current of equal to or greater than 1 mA. However, market demand for semiconductor light emitting devices to be controlled by operating currents of smaller than 1 mA is rising, in accordance with the widening diversity of applications for semiconductor light emitting devices.

A semiconductor light emitting device generally has an operating current of equal to or greater than 1 mA and has a structure in which an area ratio of a luminescent area of a light emitting layer with respect to an area of a surface of a substrate is close to "1". In a case where an operating current of smaller than 1 mA is applied to such a semiconductor light emitting device, a current density of an operating current flowing through the light emitting layer is lowered, and a luminous efficiency is thus reduced.

The first preferred embodiment of the present invention therefore provide a semiconductor light emitting device capable of increasing luminous efficiency even at an operating current of smaller than 1 mA.

The semiconductor light emitting device 1 is a low power consumption type semiconductor light emitting device controlled by an operating current $I_{LED}$ of smaller than 1 mA.

The semiconductor light emitting device 1 includes a substrate 2 having a light-transmitting property. The substrate 2 may be a sapphire substrate. The substrate 2 is formed into a rectangular solid shape. The substrate 2 has a first major surface 3, a second major surface 4 on an opposite side of the first major surface 3, and lateral surfaces 5 connecting the first major surface 3 and the second major surface 4.

Referring to FIG. 1, the first major surface 3 and second major surface 4 of the substrate 2 are formed in quadrilateral shapes in their planar views as viewed from a normal direction thereof (hereinafter referred to simply as "the planar view"). The first major surface 3 and second major surface 4 of the substrate 2 are formed in square shapes having sides of, for example, equal to or greater than 200 μm and equal to or smaller than 500 μm (400 μm in this preferred embodiment), in the planar view.

Hereinafter, the pair of lateral surfaces 5 opposing each other in a left-right direction in the plane of the drawing in FIG. 1 is referred to as the right lateral surface 5A and the left lateral surface 5B. Also, hereinafter, the pair of lateral surfaces 5 opposing each other in an upper-lower direction with respect to the plane of the drawing in FIG. 1 is referred to as the upper lateral surface 5C and the lower lateral surface 5D.

Figure 2:
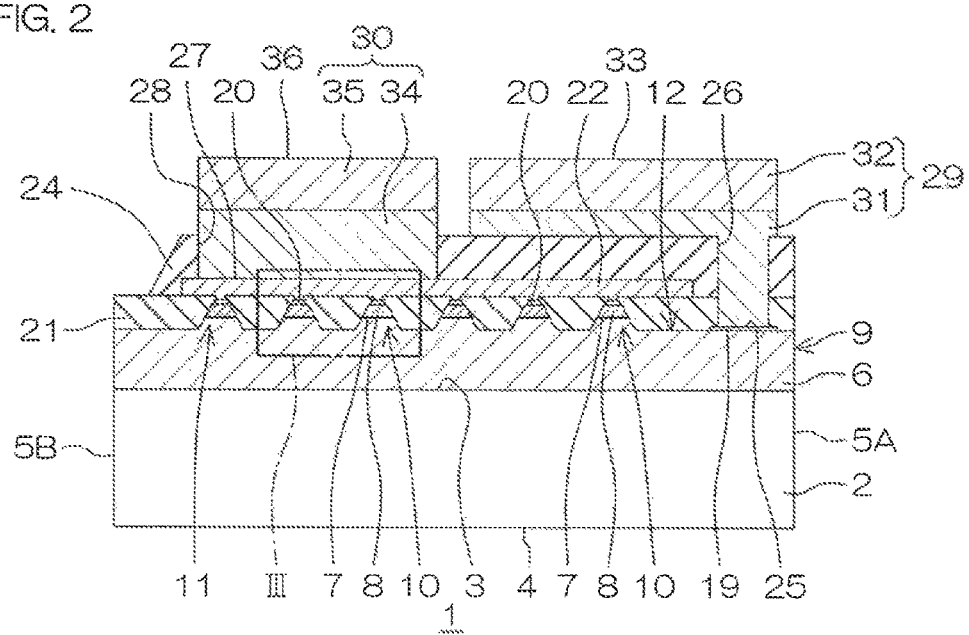
FIG. 2 is a cross-sectional view taken along line II-II shown in FIG. 1.
Figure 3:
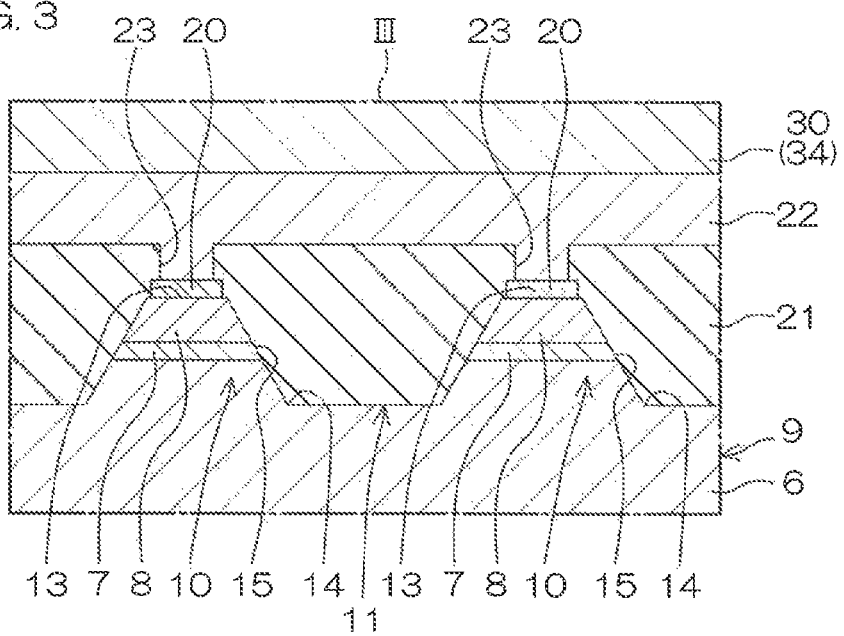
FIG. 3 is an enlarged view of region III shown in FIG. 2.
Figure 4:
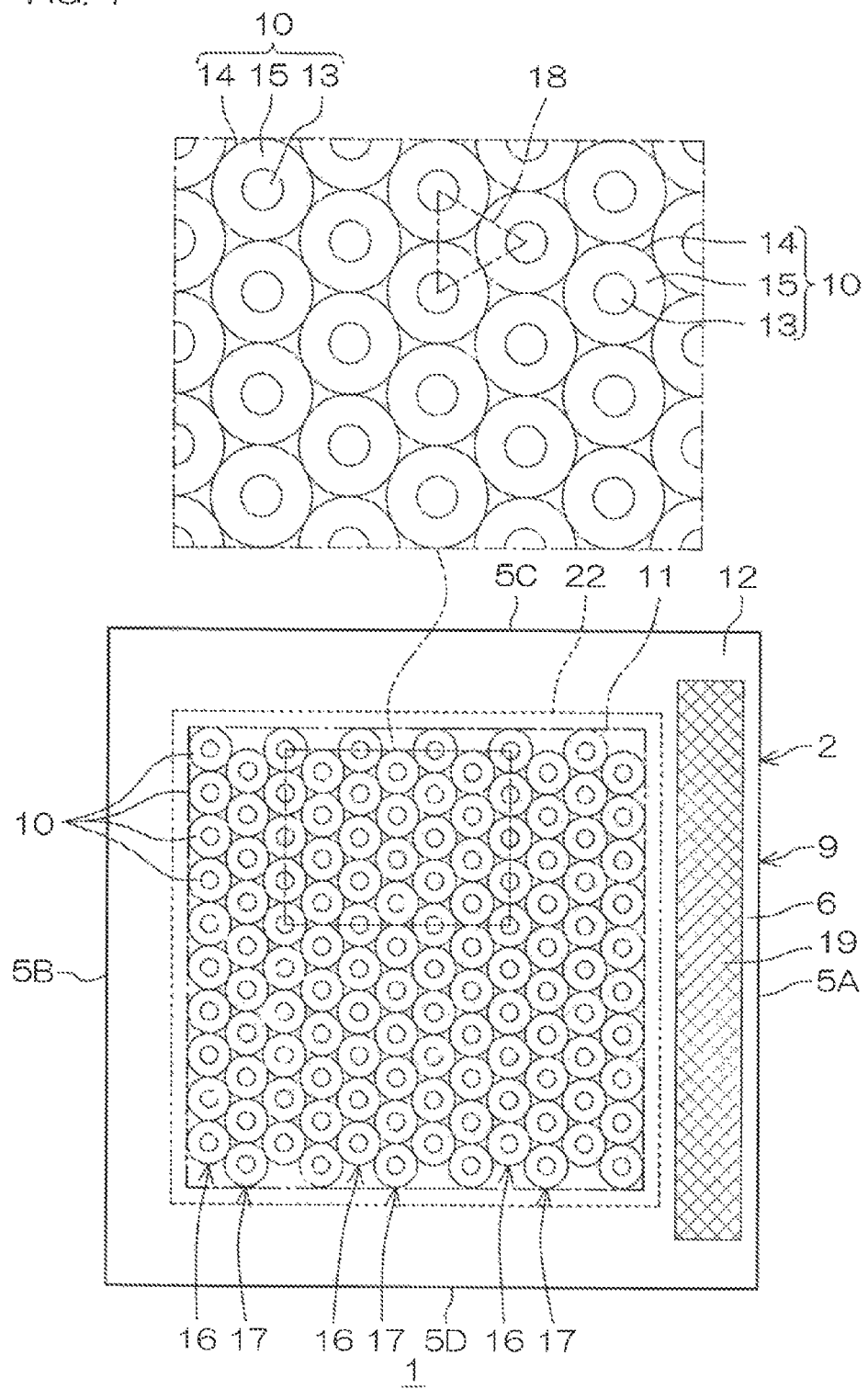

FIG. 2 is a cross-sectional view taken along line II-II shown in FIG. 1. FIG. 3 is an enlarged view of region III shown in FIG. 2. FIG. 4 is a plan view of a first embodiment example of a mesa structure 10 (described below) of the semiconductor light emitting device 1 shown in FIG. 1, where a first embodiment example of a first contact electrode film 19 (described below) is shown together with.

Referring to FIG. 2 and FIG. 3, an epitaxial layer 9 is formed on the first major surface 3 of the substrate 2, as an example of a semiconductor layer. The epitaxial layer 9 includes an n-type first semiconductor layer 6, a light emitting layer 7 and a p-type second semiconductor layer 8.

The n-type first semiconductor layer 6 is laminated on the first major surface 3 of the substrate 2. The light emitting layer 7 is laminated on the first semiconductor layer 6. The second semiconductor layer 8 is laminated on the light emitting layer 7. The first semiconductor layer 6, light emitting layer 7 and second semiconductor layer 8 include a Group III nitride semiconductor respectively. The Group III nitride semiconductor may include gallium nitride (GaN).

Referring to FIG. 4, a mesa structure forming region 11 and an outside region 12 are set in the epitaxial layer 9.

The mesa structure forming region 11 is set at approximately a central portion of the substrate 2 at intervals from the lateral surfaces 5 of the substrate 2. The mesa structure forming region 11 is set in a quadrilateral shape parallel to the lateral surfaces 5 of the substrate 2 in the planar view.

The outside region 12 is set in a region further outward than the mesa structure forming region 11. The outside region 12 is formed in a quadrilateral cyclic shape surrounding the mesa structure forming region 11, in the planar view. The outside region 12 exposes the first semiconductor layer 6. The surface of the outside region 12 is formed parallel to the first major surface 3 of the substrate 2.

Referring to FIG. 3 and FIG. 4, a plurality of mesa structures 10 (120 in this preferred embodiment) are formed in the mesa structure forming region 11 in the epitaxial layer 9. The mesa structures 10 are formed by selectively notching the first semiconductor layer 6, light emitting layer 7 and second semiconductor layer 8 so as to expose the first semiconductor layer 6.

Each mesa structure 10 is formed in a truncated conic shape, in this preferred embodiment. Each mesa structure 10 includes a flat portion 13, an outer perimeter edge 14 outside a perimeter edge of the flat portion 13, and an inclined portion 15 inclined downward from the perimeter edge of the flat portion 13 toward the outer perimeter edge 14.

The flat portion 13 of each mesa structure 10 is formed in a circular shape in the planar view. The flat portion 13 of each mesa structure 10 is formed of the second semiconductor layer 8. The outer perimeter edge 14 of each mesa structure 10 is also formed in a circular shape in the planar view. The outer perimeter edge 14 of each mesa structure 10 is formed of the first semiconductor layer 6. The inclined portion 15 of the mesa structure 10 is formed of the first semiconductor layer 6, light emitting layer 7 and second semiconductor layer 8.

Referring to FIG. 4, the plurality of mesa structures 10 are regularly arranged in the mesa structure forming region 11. More specifically, the plurality of mesa structures 10 includes a plurality of first mesa structure groups 16 (six in this preferred embodiment), and a plurality of second mesa structure groups 17 (six in this preferred embodiment).

The first mesa structure group 16 includes a plurality of mesa structures 10 (ten in this preferred embodiment) arranged in a row along one direction. The second mesa structure group 17 includes a plurality of mesa structures 10 (ten in this preferred embodiment) arranged in a row along the one direction.

The plurality of first mesa structure groups 16 and the plurality of second mesa structure groups 17 are alternately arranged along a crossing direction that crosses to the one direction. Each of the second mesa structure groups 17 is arranged in a manner shifted in the one direction with respect to each of the first mesa structure groups 16 by a radius of a single mesa structure 10, in this preferred embodiment.

The plurality of mesa structures 10 are thus arranged into a moth-eye structure, i.e. a closest packed arrangement. That is, the plurality of mesa structures 10 are arranged such that triangular regions 18 (more specifically, regular triangular regions) are delineated by straight lines connecting the central locations of every three mutually adjacent mesa structures 10, in the planar view. Also, the plurality of mesa structures 10 have a structure in which one mesa structure 10 is adjacent to six mesa structures 10 in hexagonal directions, in the planar view.

In this preferred embodiment, the term "one direction" is a direction extending along the right lateral surface 5A and the left lateral surface 5B of the substrate 2. In this preferred embodiment, the term "crossing direction" is a direction orthogonal to the one direction. Thus, the "crossing direction" is a direction extending along the upper lateral surface 5C and the lower lateral surface 5D of the substrate 2.

Referring to FIG. 2 to FIG. 4, a first contact electrode film 19 and a second contact electrode film 20 are formed on the epitaxial layer 9. In FIG. 4, the first contact electrode film 19 is shown by cross hatching for clarity. The first contact electrode film 19 may be a transparent electrode including indium tin oxide (ITO). The second contact electrode film 20 may be a transparent electrode including indium tin oxide.

The first contact electrode film 19 is connected to the first semiconductor layer 6. More specifically, the first contact electrode film 19 is connected to the outside region 12 along the perimeter edge of the mesa structure forming region 11.

The first contact electrode film 19 is formed in a region of the right lateral surface 5A side of the substrate 2 in the outside region 12 with respect to the mesa structure forming region 11. The first contact electrode film 19 is formed in a rectangular shape extending along the right lateral surface 5A of the substrate 2 in the planar view, in this preferred embodiment.

The second contact electrode film 20 is connected to each mesa structure 10. More specifically, the second contact electrode film 20 is connected to the second semiconductor layer 8 of each mesa structure 10. The second contact electrode film 20 is formed on the flat portion 13 of each mesa structure 10 so as to avoid the inclined portion 15 of each mesa structure 10.

A perimeter edge of the second contact electrode film 20 is formed on the flat portion 13 of each mesa structure 10 at intervals from the perimeter edge of the flat portion 13 to the inner region side. The second contact electrode film 20 may be formed in a circular shape along the perimeter edge of the flat portion 13, in the planar view.

Referring to FIG. 2 to FIG. 3, a first light reflecting layer 21 is formed on the epitaxial layer 9. The first light reflecting layer 21 reflects light generated at the light emitting layer 7 toward the substrate 2. The first light reflecting layer 21 covers the plurality of mesa structures 10, the first contact electrode film 19 and the second contact electrode film 20.

The first light reflecting layer 21 enters regions among the plurality of mesa structures 10 and covers the plurality of mesa structures 10. The first light reflecting layer 21 covers a whole area of the inclined portion 15 of each mesa structure 10. The first light reflecting layer 21 surrounds the light emitting layer 7 at a portion covering the inclined portion 15 of each mesa structure 10.

The area of light reflection by the first light reflecting layer 21 increases from the periphery of the light emitting layer 7 toward the substrate 2. This allows light generated at the light emitting layer 7 to be satisfactorily reflected toward the substrate 2.

The first light reflecting layer 21 includes a DBR (Distributed Bragg Reflector) layer in this preferred embodiment. The DBR layer has a laminate structure in which a plurality of insulating films having different refractive indexes are alternately laminated by ¼ wavelength optical length.

The DBR layer may be formed by at least two or more insulating materials, such as $ZrO_2$, $Al_2O_3$, $SiO_2$, $TiO_2$, $Ta_2O_5$, $Nb_2O_5$, AlN, SiN, AlON or SiON.

Referring to FIG. 2 and FIG. 3, a wiring film 22 is formed on the first light reflecting layer 21. The wiring film 22 may include at least one of aluminum (Al), silver (Ag) or gold (Au). The wiring film 22 is electrically connected to the second semiconductor layer 8 of each mesa structure 10 via the second contact electrode film 20.

More specifically, a contact opening 23 that selectively exposes each second contact electrode film 20 is formed in the first light reflecting layer 21. The wiring film 22 is connected to each second contact electrode film 20 through each contact opening 23.

The wiring film 22 is formed in a quadrilateral shape parallel to the lateral surfaces 5 of the substrate 2 in the planar view, in this preferred embodiment. The wiring film 22 covers a whole area of the mesa structure forming region 11 in this preferred embodiment. The wiring film 22 therefore faces all of the plurality of mesa structures 10 in the planar view.

A second light reflecting layer 24 is formed on the first light reflecting layer 21. The second light reflecting layer 24 reflects light generated at the light emitting layer 7 toward the substrate 2. The second light reflecting layer 24 covers the wiring film 22. The second light reflecting layer 24 may include a DBR layer having the same type of materials as the materials of the first light reflecting layer 21.

A first pad opening 26 and a second pad opening 28 are formed in the second light reflecting layer 24. The first pad opening 26 selectively exposes a portion of the first contact electrode film 19 as a first pad region 25. The second pad opening 28 selectively exposes a portion of the wiring film 22 as a second pad region 27.

A first external terminal 29 and a second external terminal 30 are formed on the second light reflecting layer 24.

The first external terminal 29 is formed at the right lateral surface 5A side of the substrate 2. The first external terminal 29 is formed in a rectangular shape extending along the right lateral surface 5A of the substrate 2, in the planar view.

The first external terminal 29 is electrically connected to the first semiconductor layer 6. More specifically, the first external terminal 29 is entered into the first pad opening 26 from above the second light reflecting layer 24. The first external terminal 29 is connected to the first contact electrode film 19 inside the first pad opening 26. The first external terminal 29 is thereby electrically connected to the first semiconductor layer 6 via the first contact electrode film 19.

The first external terminal 29 has a laminate structure including a first lower electrode layer 31 and a first upper electrode layer 32 laminated in that order from the second light reflecting layer 24 side, in this preferred embodiment. The first lower electrode layer 31 is entered into the first pad opening 26 from above the second light reflecting layer 24.

The first lower electrode layer 31 is connected to the first contact electrode film 19 inside the first pad opening 26. The first upper electrode layer 32 covers an upper surface of the first lower electrode layer 31. The first upper electrode layer 32 has a first external connection surface 33 to be externally connected to.

The first external terminal 29 is formed so as to overlap to several of the plurality of mesa structures 10, in the planar view, in this preferred embodiment. The first external connection surface 33 of the first external terminal 29 thus overlaps to several of the plurality of mesa structures 10, in the planar view.

The second external terminal 30 is formed at the left lateral surface 5B side of the substrate 2 with respect to the first external terminal 29. The second external terminal 30 is formed in a rectangular shape extending along the left lateral surface 5B of the substrate 2, in the planar view.

The second external terminal 30 is electrically connected to the second semiconductor layer 8. More specifically, the second external terminal 30 is entered into the second pad opening 28 from above the second light reflecting layer 24. The second external terminal 30 is connected to the wiring film 22 inside the second pad opening 28. The second external terminal 30 is thereby electrically connected to each mesa structure 10 via the wiring film 22.

The second external terminal 30 has a laminate structure including a second lower electrode layer 34 and a second upper electrode layer 35 laminated in that order from the second light reflecting layer 24 side in this preferred embodiment. The second lower electrode layer 34 is entered into the second pad opening 28 from above the second light reflecting layer 24.

The second lower electrode layer 34 is connected to the wiring film 22 inside the second pad opening 28. The second upper electrode layer 35 covers an upper surface of the second lower electrode layer 34. The second upper electrode layer 35 has a second external connection surface 36 to be externally connected to.

The second external terminal 30 is formed so as to overlap to several of the plurality of mesa structures 10, in the planar view. The second external connection surface 36 of the second external terminal 30 thus overlaps to several of the plurality of mesa structures 10, in the planar view.

According to the semiconductor light emitting device 1, satisfactory luminous efficiency is exhibited in a region where a value of the operating current $I_{LED}$ is relatively low at smaller than 1 mA. The operating current $I_{LED}$ is a current supplied to the epitaxial layer 9 via the first external terminal 29 and the second external terminal 30.

An area ratio $S_{total}/S_{sub}$ is set to be greater than 0 and equal to or smaller than 0.25 (0<area ratio in the semiconductor light emitting $S_{total}/S_{sub} \leq 0.25$), in the semiconductor light emitting device 1. The area ratio $S_{total}/S_{sub}$ is a ratio of a total area $S_{total}$ of the light emitting layer 7 with respect to an area $S_{sub}$ of the first major surface 3 of the substrate 2, in the planar view.

The total area $S_{total}$ of the light emitting layer 7 is a total of the luminescent area $S_{lumi}$ of each light emitting layer 7.

The area $S_{sub}$ of the first major surface 3 of the substrate 2 is 400 μm×400 μm, in this preferred embodiment. The operating current $I_{LED}$ is a total of the current flowing to each light emitting layer 7.

Four samples A1, B1, C1 and D1 were prepared to measure luminous efficiency and optical output.

The sample A1 was the semiconductor light emitting device having an area ratio $S_{total}/S_{sub}$ of 0.632. The sample B1 was the semiconductor light emitting device having an area ratio $S_{total}/S_{sub}$ of 0.25. The sample C1 was the semiconductor light emitting device having an area ratio $S_{total}/S_{sub}$ of 0.0625. The sample D1 was the semiconductor light emitting device having an area ratio $S_{total}/S_{sub}$ of 0.0225.

The sample A1 was designed so as to have the highest optical output at equal to or greater than 1 mA, in order to compare the optical outputs of the samples B1-D1. The optical outputs of the samples A1-D1 were measured by applying operating currents $I_{LED}$ of 5 μA, 12 μA and 1 mA to the samples A1-D1.

The measurement results of the optical outputs are as shown in Table 1 below. The samples A1-D1 are denoted as simply "A1-D1", in Table 1.

The optical outputs for each of the samples A1-D1 are listed in the left three subcolumns of Table 1. The ratios of optical outputs for the samples A1-D1 are listed in the right three subcolumns of Table 1. The ratios of optical outputs for each of the samples A1-D1 are values when the optical output of the sample A1 is set to "1".

TABLE 1

|    | Total area $S_{total}$ [μm²] | Area ratio $S_{total}/S_{sub}$ | Optical output Po [mW] | | | Optical output ratio | | |
|----|---|---|---|---|---|---|---|---|
|    |   |   | 5 μA | 12 μA | 1 mA | 5 μA | 12 μA | 1 mA |
| A1 | 101105 | 0.632 | 0.96 | 3.6 | 534.2 | 1 | 1 | 1 |
| B1 | 40000 | 0.25 | 1.24 | 3.9 | 679.9 | 1.30 | 1.10 | 1.27 |
| C1 | 10000 | 0.0625 | 1.85 | 5.0 | 504.7 | 1.94 | 1.39 | 0.94 |
| D1 | 3600 | 0.0225 | 3.76 | 9.3 | 460.9 | 3.94 | 2.59 | 0.86 |

Referring to Table 1, it is understood that the optical outputs of the samples A1-D1 all tended to be lowered as the operating current $I_{LED}$ is decreased.

When the operating current $I_{LED}$ was 1 mA, the optical output of the sample A1 was higher than the optical output of the samples C1 and D1. However, when the operating current $I_{LED}$ was equal to or smaller than 12 μA, the optical output of the sample A1 was lower than the optical outputs of the samples B1-D1.

It is therefore understood that the operating current $I_{LED}$ of smaller than 1 mA results in notably reduced luminous efficiency, in the sample A1. Referring to the samples A1-D1, it is understood that the optical output is increased as the total area $S_{total}$ of the light emitting layer 7 is decreased when the operating current $I_{LED}$ is equal to or smaller than 12 μA.

Referring to the samples A1-D1, the optical output is reduced as the area ratio $S_{total}/S_{sub}$ is decreased when the operating current $I_{LED}$ is 1 mA. It is therefore understood that the luminous efficiency is lowered as the area ratio $S_{total}/S_{sub}$ is decreased when the operating current $I_{LED}$ is 1 mA.

On the other hand, Referring to the samples A1-D1, the optical output is increased as the area ratio $S_{total}/S_{sub}$ is decreased when the operating current $I_{LED}$ is equal to or smaller than 12 μA. It is therefore understood that the luminous efficiency is increased as the area ratio $S_{total}/S_{sub}$ is decreased when the operating current $I_{LED}$ is equal to or smaller than 12 μA.

The sample A1 was designed under a concept of bringing the area ratio $S_{total}/S_{sub}$ closer to "1" as possible and of achieving satisfactory luminous efficiency. The sample A1 thus exhibits satisfactory luminous efficiency at the relatively high operating current $I_{LED}$ ($I_{LED}$>1 mA) in the limited area $S_{sub}$ of the first major surface 3 of the substrate 2.

When the operating current $I_{LED}$ of smaller than 1 mA is supplied to the sample A1, the total current density of the light emitting layer 7 is markedly reduced and the luminous efficiency is lowered as a result. The total current density of the light emitting layer 7 is the total current density of the operating current $I_{LED}$ flowing to each light emitting layer 7. When the operating current $I_{LED}$ of smaller than 10 μA is supplied to the sample A1, the total current density of the light emitting layer 7 is smaller than 0.01 A/cm², so that the satisfactory luminous efficiency is not obtained.

According to the samples B1-D1, on the other hand, the area ratio $S_{total}/S_{sub}$ is set to be equal to or greater than 0.01 and equal to or smaller than 0.25. This allows the total current density of the light emitting layer 7 to be increased in the samples B1-D1 compared to the sample A1, by the amount of decrease in the area ratio $S_{total}/S_{sub}$. The luminous efficiency of each light emitting layer 7 can thus be increased.

The area ratio $S_{total}/S_{sub}$ is set such that the total current density of the light emitting layer 7 is equal to or greater than 0.01 A/cm² and equal to or smaller than 10 A/cm², in this preferred embodiment, the.

Figure 5:
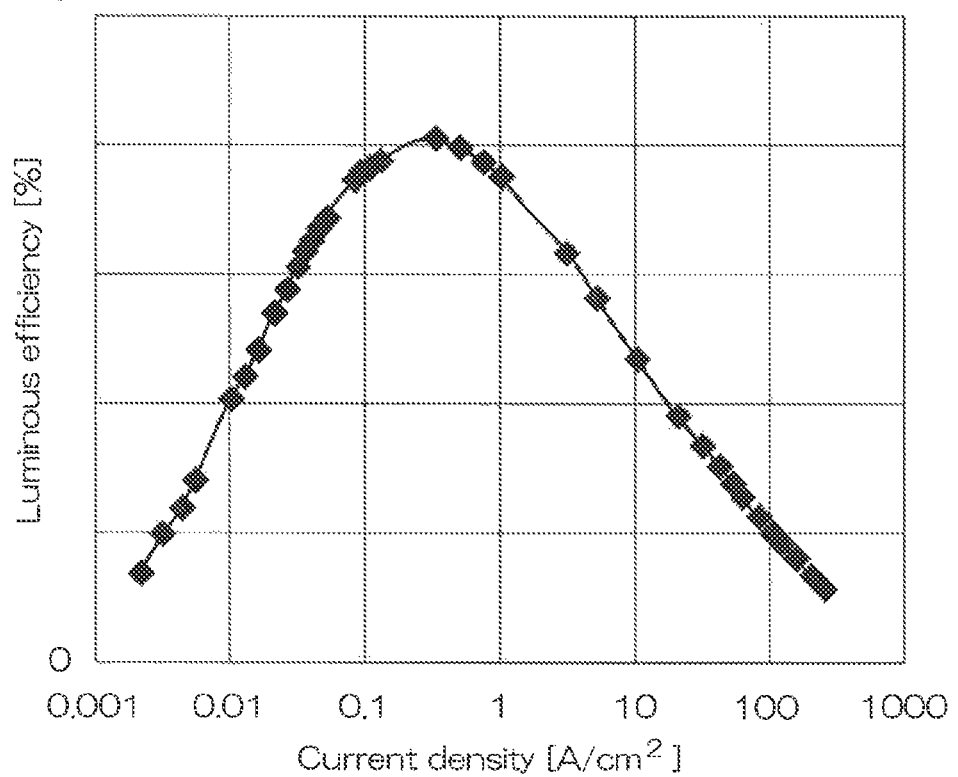
FIG. 5 is a graph showing a relationship between current density and luminous efficiency for the semiconductor light emitting device shown in FIG. 1.

FIG. 5 is a graph showing a relationship between total current density of the light emitting layer 7 and luminous efficiency. In FIG. 5, the abscissa represents the total current density of the light emitting layer 7 (A/cm²), and the ordinate represents the luminous efficiency (%).

Referring to FIG. 5, the luminous efficiency of the semiconductor light emitting device 1 has a peak value (local maximum value) in a range in which the total current density of the light emitting layer 7 is equal to or greater than 0.01 A/cm² and equal to or smaller than 10 A/cm². More specifically, the peak value is in a range of equal to or greater than 0.1 A/cm² and equal to or smaller than 1 A/cm². This indicates that an optimum value exists in the total current density of the light emitting layer 7.

Referring to FIG. 5, it is understood that the operating current $I_{LED}$ and the area ratio $S_{total}/S_{sub}$ are preferably set such that the total current density of the light emitting layer 7 is equal to or greater than 0.01 A/cm² and equal to or smaller than 10 A/cm². It is understood that the operating current $I_{LED}$ and the area ratio $S_{total}/S_{sub}$ are even more preferably set such that the total current density of the light emitting layer 7 is equal to or greater than 0.1 A/cm² and equal to or smaller than 1 A/cm².

The operating current $I_{LED}$, the area $S_{sub}$ of the first major surface 3 of the substrate 2, the total area $S_{total}$ of the light emitting layer 7, the area ratio $S_{total}/S_{sub}$, and the total current density of the light emitting layer 7, may be set to numerical values indicated in the following first to sixth setting examples.

First Setting Example

Operating current $I_{LED}$: smaller than 1 mA
Area $S_{sub}$ of first major surface 3 of substrate 2: equal to or greater than 40,000 μm² and equal to or smaller than 250,000 μm²
Total area $S_{total}$ of light emitting layer 7: equal to or greater than 400 μm² and equal to or smaller than 62,500 μm²
Area ratio $S_{total}/S_{sub}$: equal to or greater than 0.0016 and equal to or smaller than 0.25
Total current density of light emitting layer 7: equal to or greater than 0.01 A/cm² and equal to or smaller than 10 A/cm²

Second Setting Example

Operating current $I_{LED}$: smaller than 1 mA
Area $S_{sub}$ of first major surface 3 of substrate 2: equal to or greater than 40,000 μm² and equal to or smaller than 250,000 μm²
Total area $S_{total}$ of light emitting layer 7: equal to or greater than 400 μm² and equal to or smaller than 62,500 μm²
Area ratio $S_{total}/S_{sub}$: equal to or greater than 0.0016 and equal to or smaller than 0.25
Total current density of light emitting layer 7: equal to or greater than 0.1 A/cm² and equal to or smaller than 1 A/cm²

Third Setting Example

Operating current $I_{LED}$: equal to or greater than 0.1 μA and equal to or smaller than 100 μA
Area $S_{sub}$ of first major surface 3 of substrate 2: equal to or greater than 40,000 μm² and equal to or smaller than 250,000 μm²
Total area $S_{total}$ of light emitting layer 7: equal to or greater than 400 μm² and equal to or smaller than 62,500 μm²
Area ratio $S_{total}/S_{sub}$: equal to or greater than 0.0016 and equal to or smaller than 0.25
Total current density of light emitting layer 7: equal to or greater than 0.01 A/cm² and equal to or smaller than 10 A/cm²

Fourth Setting Example

Operating current $I_{LED}$: equal to or greater than 0.1 μA and equal to or smaller than 100 μA
Area $S_{sub}$ of first major surface 3 of substrate 2: equal to or greater than 40,000 μm² and equal to or smaller than 250,000 μm²
Total area $S_{total}$ of light emitting layer 7: equal to or greater than 400 μm² and equal to or smaller than 62,500 μm²
Area ratio $S_{total}/S_{sub}$: equal to or greater than 0.0016 and equal to or smaller than 0.25
Total current density of light emitting layer 7: equal to or greater than 0.1 A/cm² and equal to or smaller than 1 A/cm²

Fifth Setting Example

Operating current $I_{LED}$: equal to or greater than 1 μA and equal to or smaller than 15 μA
Area $S_{sub}$ of first major surface 3 of substrate 2: equal to or greater than 40,000 μm² and equal to or smaller than 250,000 μm²

Total area $S_{total}$ of light emitting layer 7: equal to or greater than 400 μm$^2$ and equal to or smaller than 62,500 μm$^2$ Area ratio $S_{total}/S_{sub}$: equal to or greater than 0.0016 and equal to or smaller than 0.25

Total current density of light emitting layer 7: equal to or greater than 0.01 A/cm$^2$ and equal to or smaller than 10 A/cm$^2$ Sixth Setting Example Operating current $I_{LED}$: equal to or greater than 1 μA and equal to or smaller than 15 μA Area $S_{sub}$ of first major surface 3 of substrate 2: equal to or greater than 40,000 μm$^2$ and equal to or smaller than 250,000 μm$^2$ Total area $S_{total}$ of light emitting layer 7: equal to or greater than 400 μm$^2$ and equal to or smaller than 62,500 μm$^2$ Area ratio $S_{total}/S_{sub}$: equal to or greater than 0.0016 and equal to or smaller than 0.25

Total current density of light emitting layer 7: equal to or greater than 0.1 A/cm$^2$ and equal to or smaller than 1 A/cm$^2$ As described above, according to the semiconductor light emitting device 1, the plurality of mesa structures 10 are formed in the epitaxial layer 9 under conditions in which the operating current $I_{LED}$ is smaller than 1 mA, the operating current $I_{LED}$ is equal to or greater than 0.1 μA and equal to or smaller than 100 μA or the operating current $I_{LED}$ is equal to or greater than 1 μA and equal to or smaller than 15 μA.

According to this structure, the area ratio $S_{total}/S_{sub}$ of the total area $S_{total}$ of the light emitting layer 7 with respect to the area $S_{sub}$ of the first major surface 3 of the substrate 2 is set to be equal to or greater than 0.0016 and equal to or smaller than 0.25. The area $S_{sub}$ of the first major surface 3 of the substrate 2 is set to be equal to or greater than 40,000 μm$^2$ and equal to or smaller than 250,000 μm$^2$. The total area $S_{total}$ of the light emitting layer 7 is set to be equal to or greater than 400 μm$^2$ and equal to or smaller than 62,500 μm$^2$.

The total current density of the light emitting layer 7 can thus be increased by the amount of decrease in the area ratio $S_{total}/S_{sub}$ compared to applying the operating current $I_{LED}$ of smaller than 1 mA to the sample A1.

Also, according to the semiconductor light emitting device 1, the operating current $I_{LED}$ and the total area $S_{total}$ of the light emitting layer 7 are set such that the total current density of the light emitting layer 7 is equal to or greater than 0.01 A/cm$^2$ and equal to or smaller than 10 A/cm$^2$, or equal to or greater than 0.1 A/cm$^2$ and equal to or smaller than 1 A/cm$^2$.

As shown in FIG. 5, the optical output and the luminous efficiency of the light emitting layer 7 can thus be increased. The semiconductor light emitting device 1 capable of improving optical output and luminous efficiency can thereby be provided.

Also, according to the semiconductor light emitting device 1, the light emitting layer 7 having the relatively small luminescent area $S_{lumi}$ can be formed without changing the area $S_{sub}$ of the first major surface 3 of the substrate 2. A reduction of the substrate 2 in accordance with a reduction of the luminescent area $S_{lumi}$ of the light emitting layer 7 can thus be avoided. The semiconductor light emitting device 1 capable of improving handling convenience, optical output and luminous efficiency can thereby be provided.

Also, according to the semiconductor light emitting device 1, the first light reflecting layer 21 and the second light reflecting layer 24 are formed on the epitaxial layer 9. Light can be extracted from a region of the second major surface 4 side of the substrate 2 with respect to the light emitting layer 7. According to this structure, it will be possible to provide a semiconductor light emitting device 1 having the mounted state illustrated in FIG. 6.

Figure 6:
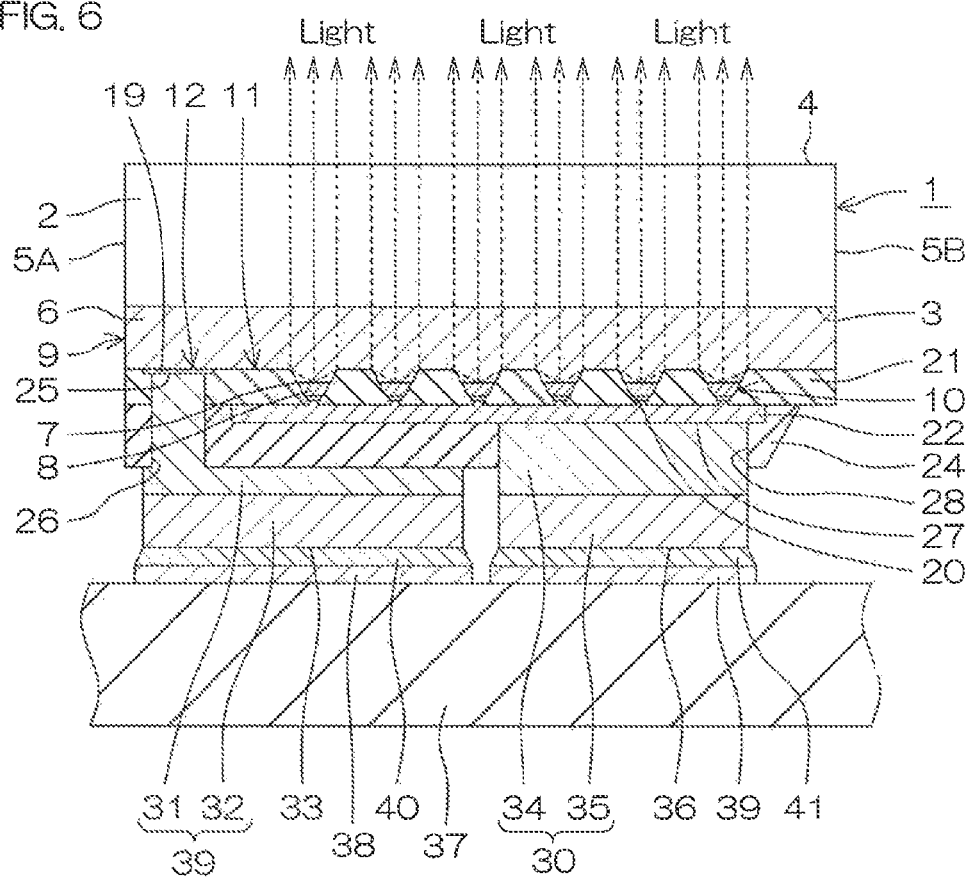
FIG. 6 is a cross-sectional view showing a mounted state of the semiconductor light emitting device shown in FIG. 1.

FIG. 6 is a cross-sectional view showing a mounted state of the semiconductor light emitting device 1 shown in FIG. 1.

Referring to FIG. 6, the semiconductor light emitting device 1 is mounted on a mounting substrate 37 in a state where the first major surface 3 of the substrate 2 is faced to a surface of the mounting substrate 37. That is, the semiconductor light emitting device 1 is mounted on the mounting substrate 37 in a face down state.

A first electrode pad 38 and a second electrode pad 39 are formed on the surface of the mounting substrate 37 at intervals. The first external terminal 29 of the semiconductor light emitting device 1 is connected to the first electrode pad 38 via a conductive bonding material 40. The second external terminal 30 of the semiconductor light emitting device 1 is connected to the second electrode pad 39 via a conductive bonding material 41.

Light generated at the light emitting layer 7 is directly extracted from the second major surface 4 of the substrate 2. In addition, light generated at the light emitting layer 7 is reflected by the first light reflecting layer 21 and the second light reflecting layer 24 toward the substrate 2, and is extracted from the second major surface 4 of the substrate 2. The second major surface 4 of the substrate 2 is therefore formed as a light extraction surface, in the semiconductor light emitting device 1.

The first light reflecting layer 21 in the semiconductor light emitting device 1 fills in the regions among the plurality of mesa structures 10, and covers the whole area of the inclined portion 15 of each mesa structure 10. Also, the area of light reflection of the first light reflecting layer 21 is increased from the light emitting layer 7 toward the substrate 2.

Light generated at the light emitting layer 7 can thus be satisfactorily reflected toward the substrate 2. The directivity of light extracted from the second major surface 4 of the substrate 2 can also be enhanced. The semiconductor light emitting device 1 having satisfactory optical output and luminous efficiency, even in the operating current $I_{LED}$ of smaller than 1 mA can thereby be provided.

Although the first preferred embodiment of the present invention have been described above, the first preferred embodiment of the present invention may be implemented in yet other modes.

In the first preferred embodiment, the first light reflecting layer 21 may include an insulating film having a light-transmitting property. The second light reflecting layer 24 may include an insulating film having a light-transmitting property. In this structure, the wiring film 22 may have a function as a light reflecting layer.

In the first preferred embodiment, the wiring film 22 may be formed as a transparent electrode containing ITO, for example. In this structure, the first light reflecting layer 21 and second light reflecting layer 24 may include a light-reflecting insulating film (a DBR layer).

In the first preferred embodiment, an area ratio $S_{mtotal}/S_{sub}$ is used, instead of the area ratio $S_{total}/S_{sub}$. The area ratio $S_{mtotal}/S_{sub}$ is a ratio of a total area $S_{mtotal}$ of the mesa structure 10 with respect to the area $S_{sub}$ of the first major surface 3 of the substrate 2. The total area $S_{mtotal}$ of the mesa structure 10 is a total of the area $S_{mesa}$ of each mesa structure 10. The area $S_{mesa}$ of each mesa structure 10 is an area inside a region surrounded by the outer perimeter edge 14 of each mesa structure 10.

The area ratio $S_{mtotal}/S_{sub}$ may be set to the same numerical value as the area ratio $S_{total}/S_{sub}$. That is, the area ratio $S_{mtotal}/S_{sub}$ may be set to be greater than 0 and equal to or smaller than 0.25 ($0<S_{mtotal}/S_{sub}\leq 0.25$).

Figure 7:
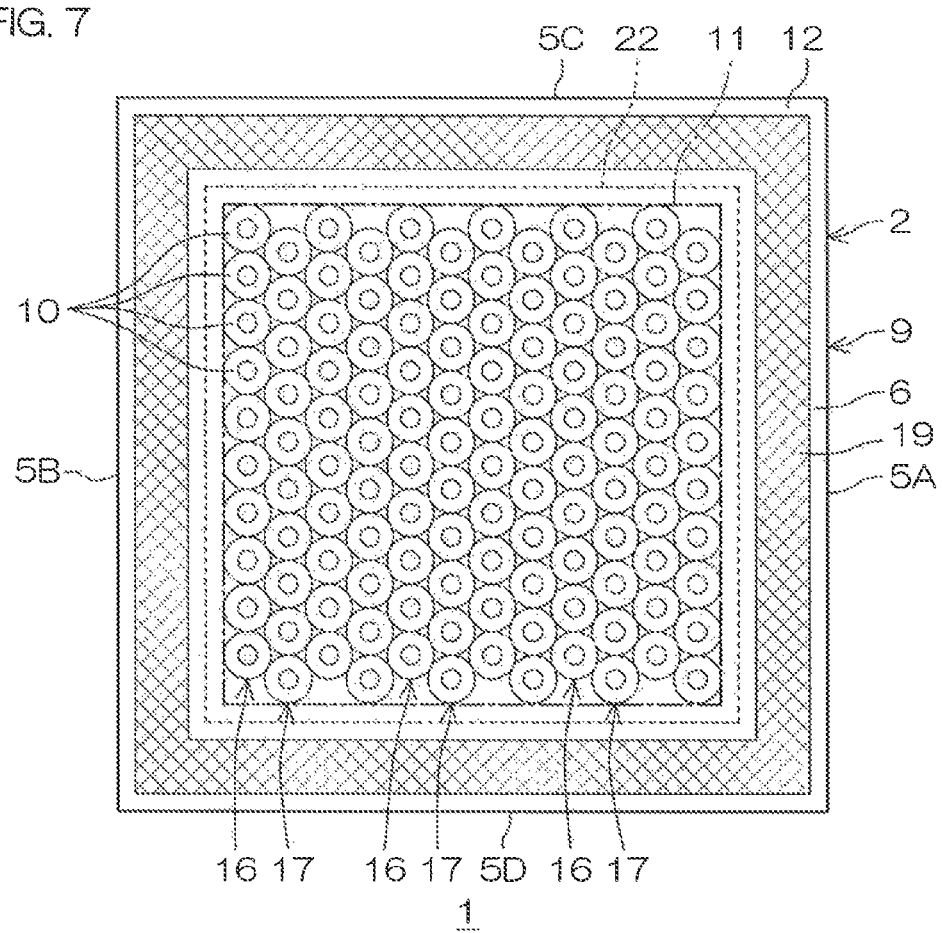
FIG. 7 is a plan view of a second embodiment example of the first contact electrode film of the semiconductor light emitting device shown in FIG. 1.

In the first preferred embodiment, the first contact electrode film 19 may have an embodiment example shown in FIG. 7. FIG. 7 is a plan view of a second embodiment example of the first contact electrode film 19 of the semiconductor light emitting device 1 shown in FIG. 1. In FIG. 7, the same reference numerals will be given to the same arrangements as those described in the first preferred embodiment, and the description thereof will be omitted.

Referring to FIG. 7, the first contact electrode film 19 is formed along the perimeter of the mesa structure forming region 11, in the planar view. The first contact electrode film 19 is formed in a quadrilateral cyclic shape surrounding the mesa structure forming region 11, in the planar view, in this example.

According to this structure, the variations occurred in a distance between the mesa structure forming region 11 and the first contact electrode film 19 can be suppressed. The variations occurred in the current supplied from the first contact electrode film 19 into the mesa structure forming region 11 can thus be suppressed. The luminous efficiency can thereby be satisfactorily increased. Furthermore, increase in size of substrate 2 can be avoided since the outside region 12 can be utilized to form the first contact electrode film 19.

Figure 8:
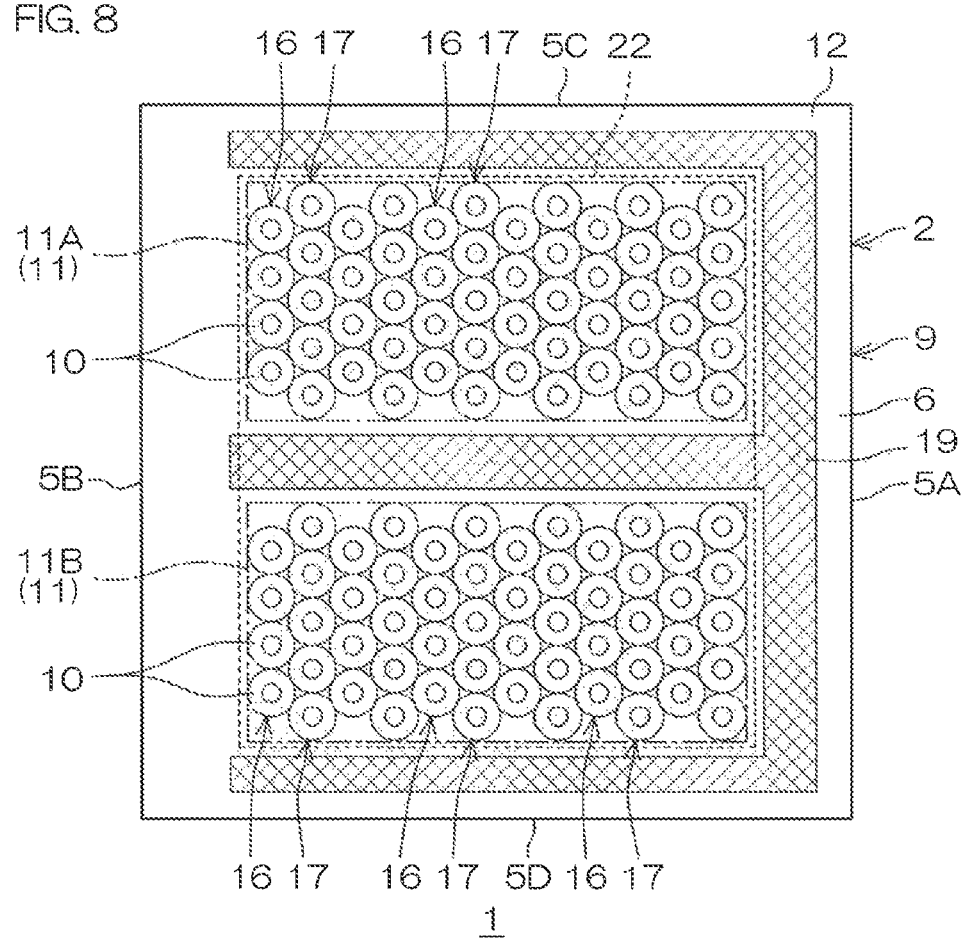
FIG. 8 is a plan view of a third embodiment example of the first contact electrode film of the semiconductor light emitting device shown in FIG. 1.

In the first preferred embodiment, the first contact electrode film 19 may have an embodiment example shown in FIG. 8. FIG. 8 is a plan view of a third embodiment example of the first contact electrode film 19 of the semiconductor light emitting device 1 shown in FIG. 1. In FIG. 8, the same reference numerals will be given to the same arrangements as those described in the first preferred embodiment, and the description thereof will be omitted.

Referring to FIG. 8, the mesa structure forming region 11 includes a first mesa structure forming region 11A and a second mesa structure forming region 11B set at intervals.

The first mesa structure forming region 11A is set at the upper lateral surface 5C side. The first mesa structure forming region 11A includes a plurality of mesa structures 10. The second mesa structure forming region 11B is set at the lower lateral surface 5D side with respect to the first mesa structure forming region 11A. The second mesa structure forming region 11B includes a plurality of mesa structures 10.

The outside region 12 is set in a quadrilateral cyclic shape that surrounds en bloc the first mesa structure forming region 11A and the second mesa structure forming region 11B, in the planar view. The outside region 12 is also set in a region between the first mesa structure forming region 11A and the second mesa structure forming region 11B.

The first contact electrode film 19 is formed in the region between the first mesa structure forming region 11A and the second mesa structure forming region 11B, so as to extend along the upper lateral surface 5C and the lower lateral surface 5D.

The first contact electrode film 19 is also formed along three of the lateral surfaces 5 of the substrate 2 (the right lateral surface 5A, the upper lateral surface 5C and the lower lateral surface 5D, for this example). As a result, the first contact electrode film 19 delineates the first mesa structure forming region 11A and the second mesa structure forming region 11B from three directions.

The first contact electrode film 19 therefore delineates the first mesa structure forming region 11A from three directions in the planar view. The first contact electrode film 19 also delineates the second mesa structure forming region 11B from three directions in the planar view.

The first contact electrode film 19 may be formed in a manner surrounding the first mesa structure forming region 11A, in the planar view. The first contact electrode film 19 may be formed in a manner surrounding the second mesa structure forming region 11B, in the planar view.

According to this structure, the variations occurred in a distance between the mesa structure forming region 11 and the first contact electrode film 19 can be suppressed. The variations occurred in the current supplied from the first contact electrode film 19 into the mesa structure forming region 11 can thus be suppressed. The luminous efficiency can thereby be satisfactorily increased. Furthermore, increase in size of substrate 2 can be avoided since the outside region 12 can be utilized to form the first contact electrode film 19.

Figure 9:
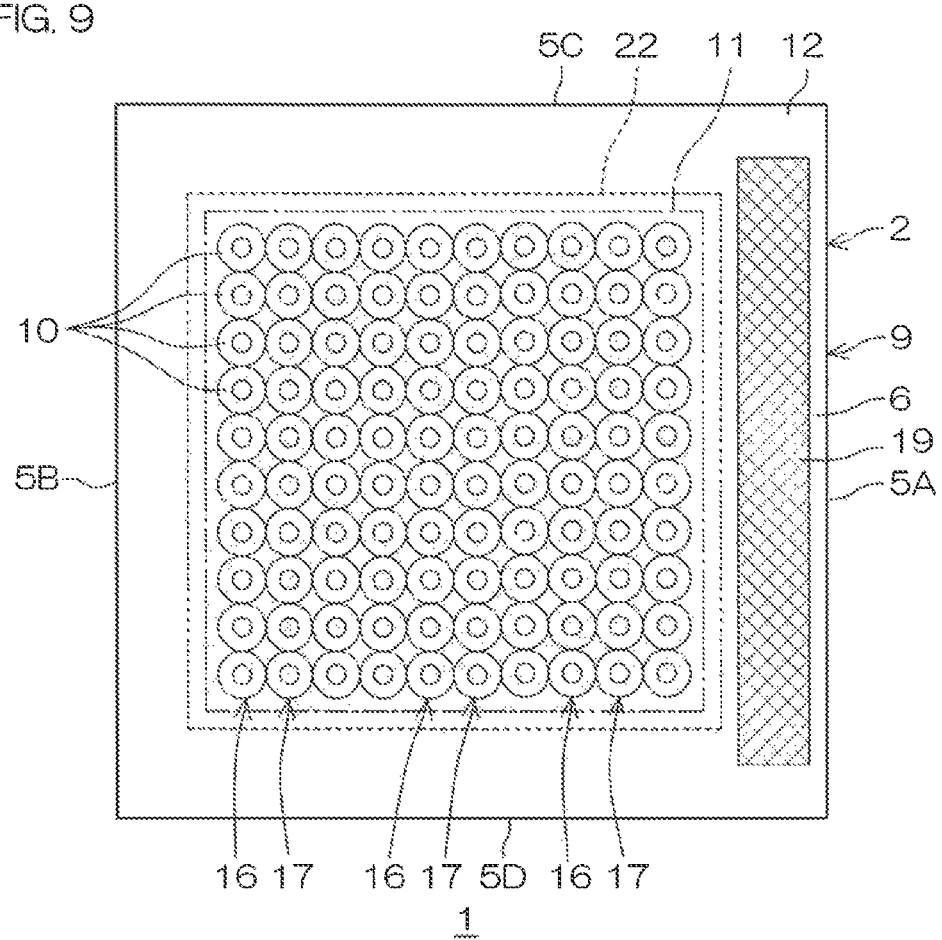
FIG. 9 is a plan view of the second embodiment example of the mesa structure of the semiconductor light emitting device shown in FIG. 1.

In the first preferred embodiment, the plurality of mesa structures 10 may have the structure shown in FIG. 9. FIG. 9 is a plan view of a second embodiment example of the plurality of mesa structures 10 of the semiconductor light emitting device 1 shown in FIG. 1. In FIG. 9, the same reference numerals will be given to the same arrangements as those described in the first preferred embodiment, and the description thereof will be omitted.

As shown in FIG. 9, the plurality of mesa structures 10 may be arranged in a matrix pattern at intervals along one direction and a crossing direction.

Figure 10:
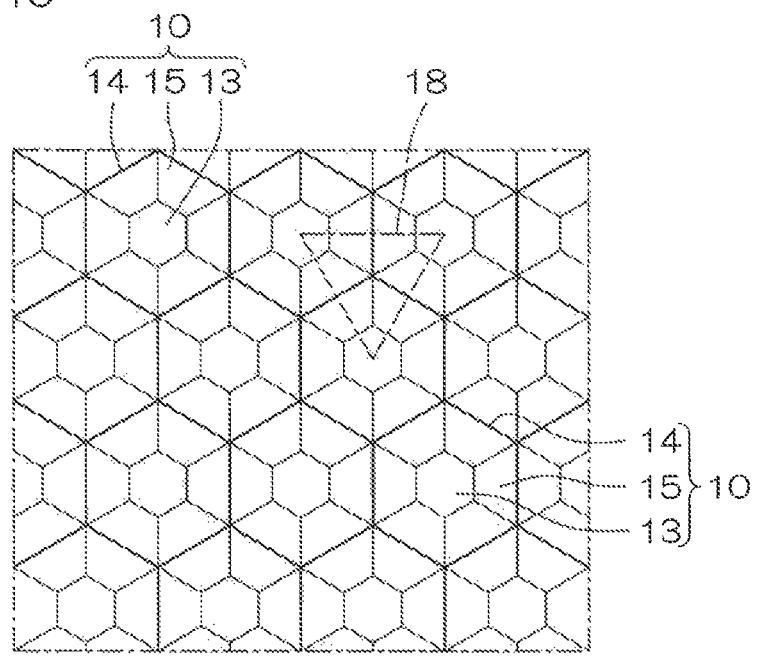
FIG. 10 is an enlarged plan view of the third embodiment example of the mesa structure of the semiconductor light emitting device shown in FIG. 1.

In the first preferred embodiment, the plurality of mesa structures 10 may have a structure shown in FIG. 10. FIG. 10 is an enlarged plan view of a third embodiment example of the plurality of mesa structures 10 of the semiconductor light emitting device 1 shown in FIG. 1. In FIG. 10, the same reference numerals will be given to the same arrangements as those described in the first preferred embodiment, and the description thereof will be omitted.

As shown in FIG. 10, each mesa structure 10 may be formed in a truncated hexagonal pyramid. That is, the flat portion 13 of each mesa structure 10 may be formed in a hexagonal shape in the planar view. The outer perimeter edge 14 of each mesa structure 10 may be formed in a hexagonal shape, in the planar view. The inclined portion 15 of each mesa structure 10 may be connecting the hexagonal flat portion 13 and the hexagonal outer perimeter edge 14.

Figure 11:
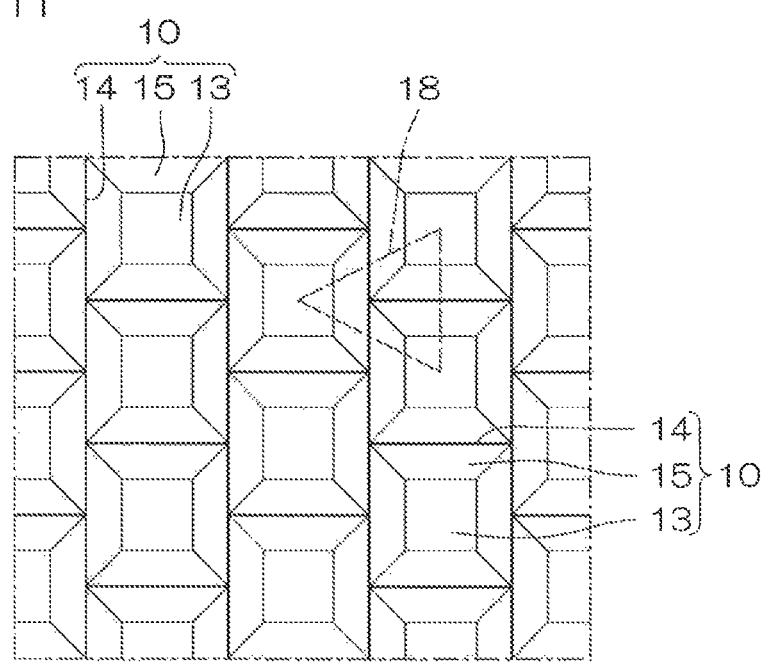
FIG. 11 is an enlarged plan view of a fourth embodiment example of the mesa structure of the semiconductor light emitting device shown in FIG. 1.

In the first preferred embodiment, the plurality of mesa structures 10 may have a structure shown in FIG. 11. FIG. 11 is an enlarged plan view of a fourth embodiment example of the plurality of mesa structures 10 of the semiconductor light emitting device 1 shown in FIG. 1. In FIG. 11, the same reference numerals will be given to the same arrangements as those described in the first preferred embodiment, and the description thereof will be omitted.

As shown in FIG. 11, each mesa structure 10 may be formed in a truncated square pyramid. That is, the flat portion 13 of each mesa structure 10 may be formed in a quadrilateral shape in the planar view. The outer perimeter edge 14 of each mesa structure 10 may be formed in a quadrilateral shape, in the planar view. The inclined portion 15 of each mesa structure 10 may be connecting the quadrilateral flat portion 13 and the hexagonal outer perimeter edge 14.

Each mesa structure 10 may be formed in a truncated polygonal pyramid. That is, the flat portion 13 of each mesa structure 10 may be formed in a polygonal shape in the planar view. The outer perimeter edge 14 of each mesa structure 10 may be formed in a polygonal shape, in the planar view. The inclined portion 15 of each mesa structure 10 may be connecting the polygonal flat portion 13 and the polygonal outer perimeter edge 14.

In a case where each mesa structure 10 is truncated conic, formation of corners in the first light reflecting layer 21 covering each mesa structure 10 at the sides of the light emitting layer 7 can be avoided. Each mesa structure 10 is therefore preferably formed in a truncated conic shape for satisfactory reflection of light.

In the first preferred embodiment, a structure where the conductive type of each semiconductor portion is inverted may be employed. That is, the p-type portion may be inverted to the n-type portion, and the n-type portion may be inverted to the p-type portion. Therefore, the epitaxial layer 9 may include a p-type first semiconductor layer 6 laminated on the first major surface 3 of the substrate 2, a light emitting layer 7 laminated on the p-type first semiconductor layer 6, and an n-type second semiconductor layer 8 laminated on the light emitting layer 7.

Figure 12:
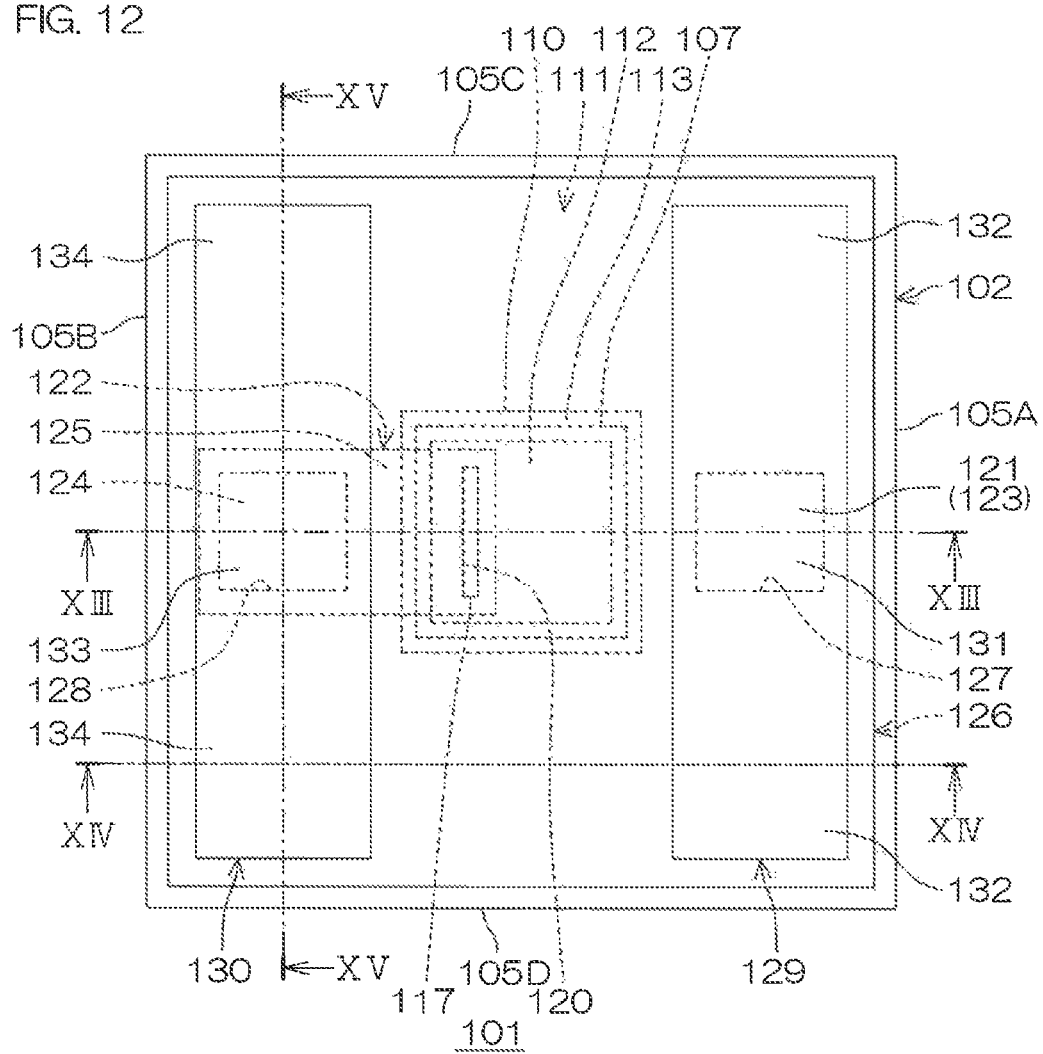
FIG. 12 is a plan view of a semiconductor light emitting device according to a second preferred embodiment of the present invention.

FIG. 12 is a plan view of a semiconductor light emitting device 101 according to the second preferred embodiment of the present invention.

A semiconductor light emitting device is generally controlled by an operating current of equal to or greater than 1 mA. However, market demand for semiconductor light emitting devices to be controlled by operating currents of smaller than 1 mA is rising, in accordance with the widening diversity of applications for semiconductor light emitting devices.

A semiconductor light emitting device generally has an operating current of equal to or greater than 1 mA and has a structure in which an area ratio of a luminescent area of a light emitting layer with respect to an area of a surface of a substrate is close to "1". In a case where an operating current of smaller than 1 mA is applied to such a semiconductor light emitting device, a current density of an operating current flowing through the light emitting layer is lowered, and a luminous efficiency is thus reduced.

The second preferred embodiment of the present invention therefore provide a semiconductor light emitting device capable of increasing luminous efficiency even at an operating current of smaller than 1 mA.

The semiconductor light emitting device 101 is a low power consumption type semiconductor light emitting device controlled by an operating current $I_{LED}$ of smaller than 1 mA.

Referring to FIG. 12, the semiconductor light emitting device 101 includes a substrate 102 having a light-transmitting property. The substrate 102 may be a sapphire substrate. The substrate 102 is formed into a rectangular solid shape. The substrate 102 has a first major surface 103, a second major surface 104 on an opposite side of the first major surface 103, and lateral surfaces 105 connecting the first major surface 103 and the second major surface 104.

The first major surface 103 and second major surface 104 of the substrate 102 are formed in quadrilateral shapes in their planar views as viewed from a normal direction thereof (hereinafter referred to simply as "the planar view"). The first major surface 103 and second major surface 104 of the substrate 102 are formed in square shapes having sides of, for example, equal to or greater than 200 μm and equal to or smaller than 500 μm (400 μm in this preferred embodiment), in the planar view.

Hereinafter, the pair of lateral surfaces 105 opposing each other in a left-right direction in the plane of the drawing in FIG. 12 is referred to as the right lateral surface 105A and the left lateral surface 105B. Also, hereinafter, the pair of lateral surfaces 105 opposing each other in an upper-lower direction with respect to the plane of the drawing in FIG. 12 is referred to as the upper lateral surface 105C and the lower lateral surface 105D.

Figure 13:
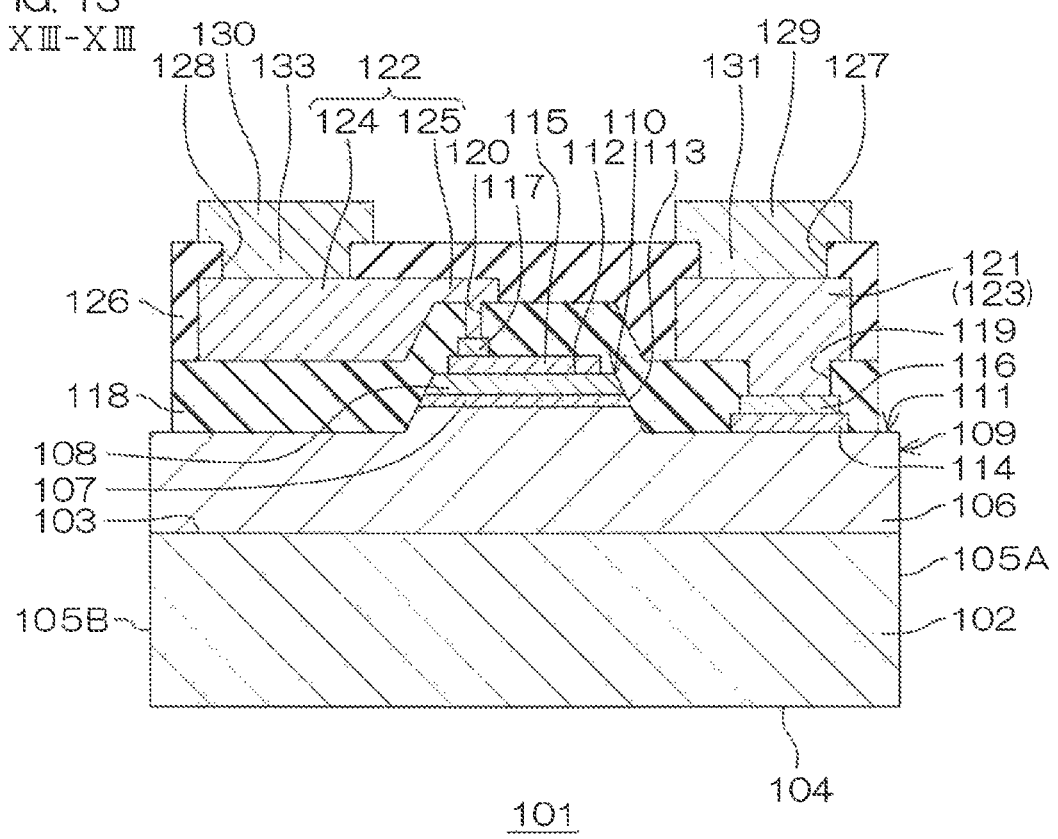
FIG. 13 is a cross-sectional view taken along line XIII-XIII shown in FIG. 12.
Figure 14:
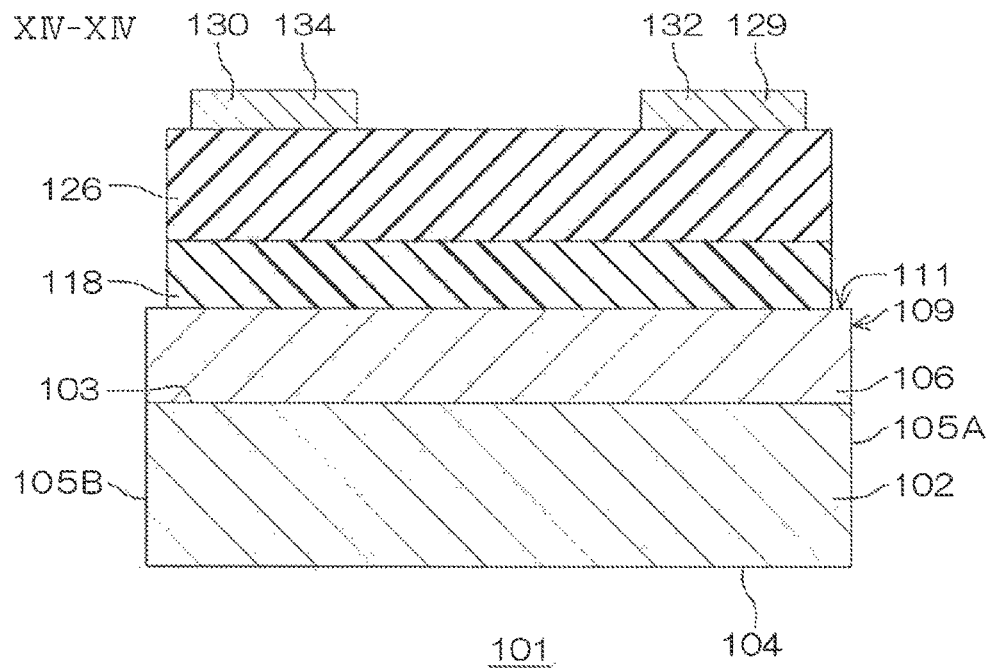
FIG. 14 is a cross-sectional view taken along line XIV-XIV shown in FIG. 12.
Figure 15:
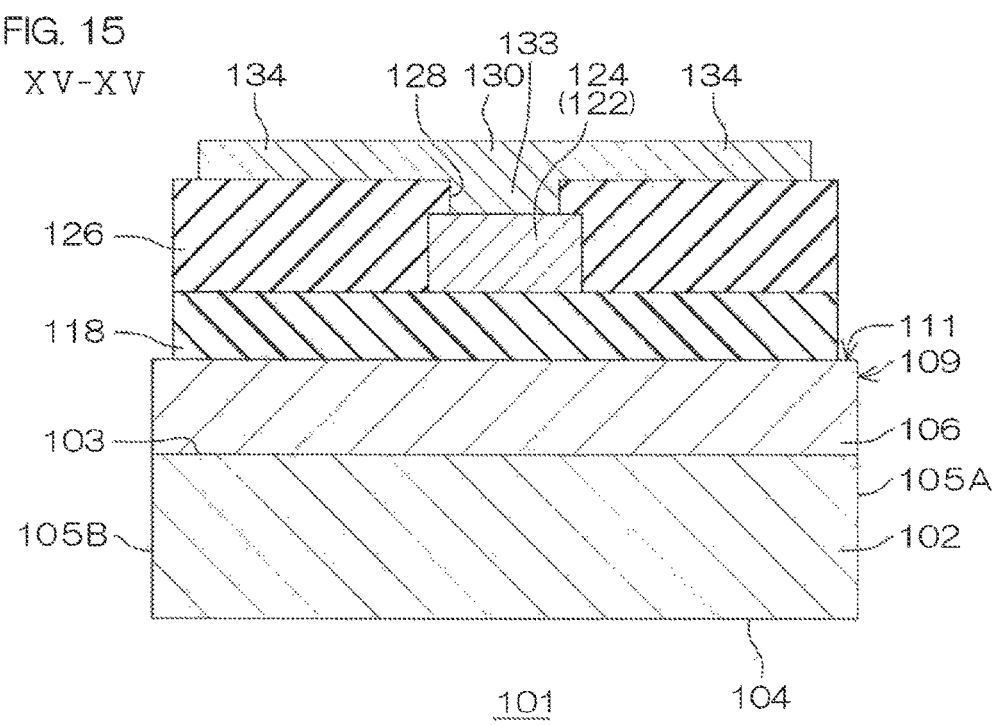
FIG. 15 is a cross-sectional view taken along line XV-XV shown in FIG. 12.

FIG. 13 is a cross-sectional view taken along line XIII-XIII shown in FIG. 12. FIG. 14 is a cross-sectional view taken along line XIV-XIV shown in FIG. 12. FIG. 15 is a cross-sectional view taken along line XV-XV shown in FIG. 12.

Referring to FIG. 13 to FIG. 15, an epitaxial layer 109 is formed on the first major surface 103 of the substrate 102, as an example of a semiconductor layer. The epitaxial layer 109 includes an n-type first semiconductor layer 106, a light emitting layer 107 and a p-type second semiconductor layer 108.

The n-type first semiconductor layer 106 is laminated on the first major surface 103 of the substrate 102. The light emitting layer 107 is laminated on the first semiconductor layer 106. The second semiconductor layer 108 is laminated on the light emitting layer 107. The first semiconductor layer 106, light emitting layer 107 and second semiconductor layer 108 include a Group III nitride semiconductor respectively. The Group III nitride may include gallium nitride (GaN).

A mesa structure 110 is formed in the epitaxial layer 109. The mesa structure 110 is formed by selectively notching the first semiconductor layer 106, light emitting layer 107 and second semiconductor layer 108 so as to expose the first semiconductor layer 106.

The mesa structure 110 is formed at approximately the central portion of the substrate 102, separated by a spacing from the lateral surfaces 105 of the substrate 102. The mesa structure 110 is formed in a truncated square pyramid, in this preferred embodiment. In the mesa structure 110, the light emitting layer 107 has a smaller luminescent area $S_{lumi}$ than the area $S_{sub}$ of the first major surface 103 of the substrate 102, in the planar view.

The mesa structure 110 includes a flat portion 112 and an inclined portion 113. The inclined portion 113 is inclined downward from a perimeter edge of the flat portion 112 toward an outer perimeter edge that is located outside the perimeter edge of the flat portion 112.

The flat portion 112 of the mesa structure 110 is formed in a quadrilateral shape parallel to the lateral surfaces 105 of the substrate 102 in the planar view. The flat portion 112 of the mesa structure 110 is formed by the second semiconductor layer 108.

The outer perimeter edge of the mesa structure 110 is formed in a quadrilateral shape parallel to the lateral surfaces 105 of the substrate 102 in the planar view. The outer perimeter edge of the mesa structure 110 is formed by the first semiconductor layer 106. The inclined portion 113 of the mesa structure 110 is formed by the first semiconductor layer 106, light emitting layer 107 and second semiconductor layer 108.

An outside region 111 is set in a region outside the mesa structure 110 in the epitaxial layer 109. The outside region 111 is formed in a quadrilateral cyclic shape surrounding the mesa structure 110 in the planar view. The outside region 111 has a single-layer structure composed of the first semiconductor layer 106. The first semiconductor layer 106 is therefore exposed from the outside region 111. The surface of the outside region 111 is formed parallel to the first major surface 103 of the substrate 102.

A first internal electrode film 114 and a second internal electrode film 115 are formed on the epitaxial layer 109. The first internal electrode film 114 may be a transparent electrode including indium tin oxide (ITO). The second internal electrode film 115 may be a transparent electrode including indium tin oxide (ITO).

The first internal electrode film 114 is connected to the first semiconductor layer 106. More specifically, the first internal electrode film 114 is formed along the perimeter edge of the mesa structure 110 and connected to the outside region 111. The first internal electrode film 114 is formed in a region of the right lateral surface 105A side of the substrate 102 with respect to the mesa structure 110. The first internal electrode film 114 is formed in a rectangular shape extending along the right lateral surface 105A of the substrate 102, in the planar view.

The second internal electrode film 115 is connected to the mesa structure 110. More specifically, the second internal electrode film 115 is connected to the second semiconductor layer 108 of the mesa structure 110. The second internal electrode film 115 is formed on the flat portion 112 of the mesa structure 110 so as to avoid the inclined portion 113 of the mesa structure 110.

A perimeter edge of the second internal electrode film 115 is formed on the mesa structure 110 at intervals from the perimeter edge of the flat portion 112 to an inner region side. The second internal electrode film 115 may be formed in a quadrilateral shape along the perimeter edge of the flat portion 112, in the planar view.

A first electrode film 116 is selectively formed on the first internal electrode film 114. The first electrode film 116 covers substantially an entire region of the surface of the first internal electrode film 114, in this preferred embodiment. The first electrode film 116 may include at least one of Cr, Ti, Pt, Au or Al.

A second electrode film 117 is selectively formed on the second internal electrode film 115. The second electrode film 117 is formed along the perimeter edge of the second internal electrode film 115. The second electrode film 117 is formed in a region of the left lateral surface 105B side of the substrate 102 on the second internal electrode film 115, in this preferred embodiment.

The second electrode film 117 is formed in a rectangular shape extending along the left lateral surface 105B of the substrate 102, in the planar view, in this preferred embodiment. The second electrode film 117 may include at least one of Cr, Ti, Pt, Au or Al.

A first light reflecting layer 118 is formed on the epitaxial layer 109. The first light reflecting layer 118 reflects light generated at the light emitting layer 107 toward the substrate 102. The first light reflecting layer 118 covers the first internal electrode film 114, the second internal electrode film 115, the first electrode film 116 and the second electrode film 117.

The first light reflecting layer 118 includes a DBR (Distributed Bragg Reflector) layer, in this preferred embodiment. The DBR layer has a laminate structure in which a plurality of insulating films having different refractive indexes are alternately laminated by ¼ wavelength optical lengths.

The DBR layer may be formed by at least two or more insulating materials, such as $ZrO_2$, $Al_2O_3$, $SiO_2$, $TiO_2$, $Ta_2O_5$, $Nb_2O_5$, AlN, SiN, AlON or SiON.

Referring to FIG. 13, a first contact opening 119 and a second contact opening 120 are formed in the first light reflecting layer 118. The first contact opening 119 selectively exposes the first electrode film 116. The second contact opening 120 selectively exposes the second electrode film 117. The second contact opening 120 is formed in a rectangular shape extending along the second electrode film 117, in the planar view, in this preferred embodiment.

The first contact opening 119 and the second contact opening 120 are formed by selectively removing the first light reflecting layer 118, by an etching method. The first electrode film 116 and the second electrode film 117 are formed as an etching stop layer respectively.

The first electrode film 116 suppresses removal of the first internal electrode film 114 (outside region 111) by etching. The second electrode film 117 suppresses removal of the second internal electrode film 115 (mesa structure 110) by etching.

Referring to FIG. 12 and FIG. 13, a first wiring electrode 121 and a second wiring electrode 122 are formed on the first light reflecting layer 118. The first wiring electrode 121 is electrically connected to the first semiconductor layer 106 via the first internal electrode film 114. The second wiring electrode 122 is electrically connected to the second semiconductor layer 108 via the second internal electrode film 115.

The first wiring electrode 121 may be a transparent electrode including zinc oxide (ZnO) or indium tin oxide (ITO). The first wiring electrode 121 may be a metal electrode including Al or Au. The second wiring electrode 122 may be a transparent electrode including zinc oxide (ZnO) or indium tin oxide (ITO). The second wiring electrode 122 may be a metal electrode including Al or Au.

The first wiring electrode 121 includes a first pad portion 123. The first pad portion 123 is formed in a region directly above the first internal electrode film 114. The first pad portion 123 is formed in a quadrilateral shape, in the planar view. The first pad portion 123 is formed in a region that does not overlap to the mesa structure 110, in the planar view.

The first pad portion 123 is entered into the first contact opening 119 from above the first light reflecting layer 118. The first pad portion 123 is electrically connected to the first internal electrode film 114 via the first electrode film 116, inside the first contact opening 119.

The second wiring electrode 122 includes a second pad portion 124 and a lead-out portion 125. The second pad portion 124 is formed in the region between the mesa structure 110 and the left lateral surface 105B on the first light reflecting layer 118, in the planar view. The second pad portion 124 is formed in a rectangular shape, in the planar view. The second pad portion 124 is formed in a region that does not overlap to the mesa structure 110, in the planar view.

The lead-out portion 125 is formed in the region on the mesa structure 110 side with respect to the second pad portion 124. The lead-out portion 125 is led out from the second pad portion 124 toward the second internal electrode film 115 side. The lead-out portion 125 is led out from the entire edge region of the second pad portion 124 on the mesa structure 110 side. The lead-out portion 125 is formed on the first light reflecting layer 118 so as to expose an inner portion of the second internal electrode film 115, in the planar view.

The lead-out portion 125 is entered into the second contact opening 120 from above the first light reflecting layer 118. The lead-out portion 125 is electrically connected to the second internal electrode film 115 via the second electrode film 117, inside the second contact opening 120.

Referring to FIG. 13, a second light reflecting layer 126 is formed on the first light reflecting layer 118. The second light reflecting layer 126 reflects light generated at the light emitting layer 107 toward the substrate 102. The second light reflecting layer 126 covers the first wiring electrode 121 and the second wiring electrode 122. The second light reflecting layer 126 may include a DBR layer that includes the same type of materials as the materials of the first light reflecting layer 118.

Referring to FIG. 12, FIG. 13 and FIG. 15, a first pad opening 127 and a second pad opening 128 are formed in the second light reflecting layer 126. The first pad opening 127 selectively exposes the first pad portion 123 of the first wiring electrode 121. The second pad opening 128 selectively exposes the second pad portion 124 of the second wiring electrode 122.

Referring to FIG. 12 to FIG. 15, a first external terminal 129 and a second external terminal 130 are formed on the second light reflecting layer 126. The first external terminal 129 is electrically connected to the first semiconductor layer 106 via the first wiring electrode 121, and the second external terminal 130 is electrically connected to the second semiconductor layer 108 via the second wiring electrode 122.

The first external terminal 129 may be a metal electrode including Al, Au or Sn. The second external terminal 130 may be a metal electrode including Al, Au or Sn.

The first external terminal 129 is formed on the second light reflecting layer 126 in a region of the right lateral surface 105A side of the substrate 102 on the second light reflecting layer 126. The first external terminal 129 is formed in a rectangular shape extending along the right lateral surface 105A of the substrate 102, in the planar view. The first external terminal 129 includes a first connecting portion 131 and a first lead-out portion 132.

The first connecting portion 131 of the first external terminal 129 is formed at approximately a central portion of the first external terminal 129 in a lengthwise direction thereof. The first connecting portion 131 of the first external terminal 129 is connected to the first pad portion 123, inside the first pad opening 127.

The first lead-out portion 132 of the first external terminal 129 is led out from the first connecting portion 131 toward the upper lateral surface 105C side and the lower lateral surface 105D side of the substrate 102. The first lead-out portion 132 of the first external terminal 129 faces the outside region 111 of the epitaxial layer 109, in the planar view.

The second external terminal 130 is formed in a region of the left lateral surface 105B side of the substrate 102 on the second light reflecting layer 126. The second external terminal 130 is formed in a rectangular shape extending along the left lateral surface 105B of the substrate 102, in the planar view. The second external terminal 130 includes a second connecting portion 133 and a second lead-out portion 134.

The second connecting portion 133 of the second external terminal 130 is formed at approximately a central portion of the second external terminal 130 in a lengthwise direction thereof. The second connecting portion 133 of the second external terminal 130 is connected to the second pad portion 124 inside the second pad opening 128.

The second lead-out portion 134 of the second external terminal 130 is led out from the second connecting portion 133 toward the top lateral surface 105C side and the bottom lateral surface 105D side of the substrate 102. The second lead-out portion 134 of the second external terminal 130 faces the outside region 111 of the epitaxial layer 109, in the planar view.

Referring to FIG. 12 and FIG. 13, the first external terminal 129 and the second external terminal 130 are formed so as to sandwich the mesa structure 110, in the planar view. The first external terminal 129 and the second external terminal 130 are both formed in regions on the outside region 111 of the epitaxial layer 109 so as not to overlap to the mesa structure 110, in the planar view.

According to the semiconductor light emitting device 101, satisfactory luminous efficiency is exhibited in a region where a value of the operating current $I_{LED}$ is relatively low at smaller than 1 mA. The operating current $I_{LED}$ is a current supplied to the epitaxial layer 109 via the first external terminal 129 and the second external terminal 130. The operating current $I_{LED}$ is also a current flowing to the light emitting layer 107.

An area ratio $S_{lumi}/S_{sub}$ is set to be greater than 0 and equal to or smaller than 0.25 (0<area ratio $S_{lumi}/S_{sub}$≤0.25) in the semiconductor light emitting device 101. The area ratio $S_{lumi}/S_{sub}$ is a ratio of the luminescent area $S_{lumi}$ of the light emitting layer 107 with respect to the area $S_{sub}$ of the first major surface 103 of the substrate 102, in the planar view. The area $S_{sub}$ of the first major surface 103 of the substrate 102 is 400 μm×400 μm, in this preferred embodiment.

Four samples A2, B2, C2 and D2 were prepared to measure luminous efficiency and optical output.

The sample A2 was the semiconductor light emitting device having the area ratio $S_{lumi}/S_{sub}$ of 0.632. The sample B2 was the semiconductor light emitting device having the area ratio $S_{lumi}/S_{sub}$ of 0.25. The sample C2 was the semiconductor light emitting device having the area ratio $S_{lumi}/S_{sub}$ of 0.0625. The sample D2 was the semiconductor light emitting device having the area ratio $S_{lumi}/S_{sub}$ of 0.0225.

The sample A2 was designed so as to have the highest optical output at equal to or greater than 1 mA, in order to compare the optical outputs of the samples B2-D2. The optical outputs of the samples A2-D2 were measured by applying operating currents $I_{LED}$ of 5 μA, 12 μA and 1 mA to the samples A2-D2.

The measurement results of the optical outputs are as shown in Table 2 below. The samples A2-D2 are denoted as simply "A2-D2", in Table 2.

The optical outputs for each of the samples A2-D2 are listed in the left three subcolumns of Table 2. The ratios of optical outputs for the samples A2-D2 are listed in the right three subcolumns of Table 2. The ratios of optical outputs for each of the samples A2-D2 are values when the optical output of the sample A1 is set to "1".

TABLE 2

| | Luminescent area $S_{lumi}$ [μm²] | Area ratio $S_{lumi}/S_{sub}$ [μm²] | Optical output Po [mW] | | | Optical output ratio | | |
|---|---|---|---|---|---|---|---|---|
| | | | 5 μA | 12 μA | 1 mA | 5 μA | 12 μA | 1 mA |
| A2 | 101105 | 0.632 | 0.96 | 3.6 | 534.2 | 1 | 1 | 1 |
| B2 | 40000 | 0.25 | 1.24 | 3.9 | 679.9 | 1.30 | 1.10 | 1.27 |
| C2 | 10000 | 0.0625 | 1.85 | 5.0 | 504.7 | 1.94 | 1.39 | 0.94 |
| D2 | 3600 | 0.0225 | 3.76 | 9.3 | 460.9 | 3.94 | 2.59 | 0.86 |

Referring to Table 2, it is understood that the optical outputs of the samples A2-D2 all tended to be lowered as the decreasing operating current $I_{LED}$ is decreased.

When the operating current $I_{LED}$ was 1 mA, the optical output of the sample A2 was higher than the optical output of the samples C2 and D2. However, when the operating current $I_{LED}$ was equal to or smaller than 12 µA, the optical output of the sample A2 was lower than the optical outputs of the samples B2-D2.

It is therefore understood that the operating current $I_{LED}$ of smaller than 1 mA results in notably reduced luminous efficiency, in the sample A2. Referring to the samples A2-D2, it is understood that the optical output is increased as the smaller luminescent area $S_{lumi}$ of the light emitting layer 107 is decreased when the operating current $I_{LED}$ is equal to or smaller than 12 µA.

Referring to the samples A2-D2, the optical output is reduced as the area ratio $S_{lumi}/S_{sub}$ is decreased when the operating current $I_{LED}$ is 1 mA. It is therefore understood that the luminous efficiency is lowered as the area ratio $S_{lumi}/S_{sub}$ is decreased when the operating current $I_{LED}$ is 1 mA.

On the other hand, Referring to the samples A2-D2, the optical output is increased as the area ratio $S_{lumi}/S_{sub}$ is decreased when the operating current $I_{LED}$ is equal to or smaller than 12 µA. It is therefore understood that the luminous efficiency is increased as the area ratio $S_{lumi}/S_{sub}$ is decreased when the operating current $I_{LED}$ is equal to or smaller than 12 µA.

The sample A2 was designed under a concept of bringing the area ratio $S_{lumi}/S_{sub}$ closer to "1" as possible and of achieving satisfactory luminous efficiency. The sample A2 thus exhibits satisfactory luminous efficiency at the relatively high operating current $I_{LED}$ ($I_{LED}$>1 mA) in the limited area $S_{sub}$ of the first major surface 103 of the substrate 102.

When the operating current $I_{LED}$ of smaller than 1 mA is supplied to the sample A2, the current density of the light emitting layer 107 is markedly reduced and the luminous efficiency is lowered as a result. When the operating current $I_{LED}$ of smaller than 10 µA is supplied to the sample A2, the current density of the light emitting layer 107 is smaller than 0.01 A/cm², so that the satisfactory luminous efficiency is not obtained.

According to the samples B2-D2, on the other hand, the area ratio $S_{lumi}/S_{sub}$ is set to be equal to or greater than 0.01 and equal to or smaller than 0.25. This allows the current density of the light emitting layer 107 to be increased in the samples B2-D2 compared to the sample A2, by the amount of decrease in the area ratio $S_{lumi}/S_{sub}$. The luminous efficiency of the light emitting layer 107 can thus be increased.

The area ratio $S_{lumi}/S_{sub}$ is set such that the current density of the light emitting layer 107 is equal to or greater than 0.01 A/cm² and equal to or smaller than 10 A/cm², in this preferred embodiment.

Figure 16:
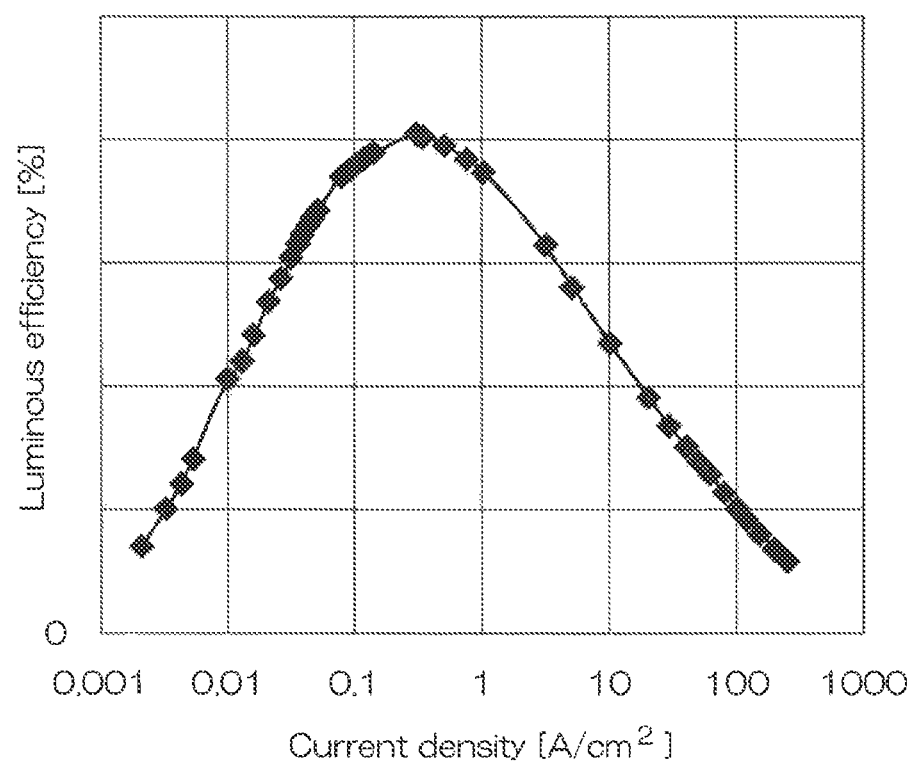
FIG. 16 is a graph showing a relationship between current density and luminous efficiency for the semiconductor light emitting device shown in FIG. 12.

FIG. 16 is a graph showing a relationship between total current density of the light emitting layer 107 and luminous efficiency. In FIG. 16, the abscissa represents the current density of the light emitting layer 107 (A/cm²), and the ordinate represents the luminous efficiency (%).

Referring to FIG. 16, the luminous efficiency of the semiconductor light emitting device 101 has a peak value (local maximum value) in a range in which the current density of the light emitting layer 107 is equal to or greater than 0.01 A/cm² and equal to or smaller than 10 A/cm². More specifically, the peak value is in a range equal to or greater than 0.1 A/cm² and equal to or smaller than 1 A/cm².

This indicates that an optimum value exists in the current density of the light emitting layer 107.

Referring to FIG. 16, it is understood that the operating current $I_{LED}$ and the area ratio $S_{lumi}/S_{sub}$ are preferably set such that the current density of the light emitting layer 107 is equal to or greater than 0.01 A/cm² and equal to or smaller than 10 A/cm². It is understood that the operating current $I_{LED}$ and the area ratio $S_{lumi}/S_{sub}$ are more preferably set such that the current density of the light emitting layer 107 is equal to or greater than 0.1 A/cm² and equal to or smaller than 1 A/cm².

The operating current $I_{LED}$, the area $S_{sub}$ of the first major surface 103 of the substrate 102, the luminescent area $S_{lumi}$ of the light emitting layer 107, the area ratio $S_{lumi}/S_{sub}$ and the current density of the light emitting layer 107, may be set to numerical values indicated in the following first to sixth setting examples.

First Setting Example

Operating current $I_{LED}$: smaller than 1 mA
Area $S_{sub}$ of first major surface 103 of substrate 102: equal to or greater than 40,000 µm² and equal to or smaller than 250,000 µm²
Luminescent area $S_{lumi}$ of light emitting layer 107: equal to or greater than 400 µm² and equal to or smaller than 62,500 µm²
Area ratio $S_{lumi}/S_{sub}$: equal to or greater than 0.0016 and equal to or smaller than 0.25
Current density of light emitting layer 107: equal to or greater than 0.01 A/cm² and equal to or smaller than 10 A/cm²

Second Setting Example

Operating current $I_{LED}$: smaller than 1 mA
Area $S_{sub}$ of first major surface 103 of substrate 102: equal to or greater than 40,000 µm² and equal to or smaller than 250,000 µm²
Luminescent area $S_{lumi}$ of light emitting layer 107: equal to or greater than 400 µm² and equal to or smaller than 62,500 µm²
Area ratio $S_{lumi}/S_{sub}$: equal to or greater than 0.0016 and equal to or smaller than 0.25
Current density of light emitting layer 107: equal to or greater than 0.1 A/cm² and equal to or smaller than 1 A/cm²

Third Setting Example

Operating current $I_{LED}$: equal to or greater than 0.1 µA and equal to or smaller than 100 µA
Area $S_{sub}$ of first major surface 103 of substrate 102: equal to or greater than 40,000 µm² and equal to or smaller than 250,000 µm²
Luminescent area $S_{lumi}$ of light emitting layer 107: equal to or greater than 400 µm² and equal to or smaller than 62,500 µm²
Area ratio $S_{lumi}/S_{sub}$: equal to or greater than 0.0016 and equal to or smaller than 0.25
Current density of light emitting layer 107: equal to or greater than 0.01 A/cm² and equal to or smaller than 10 A/cm²

Fourth Setting Example

Operating current $I_{LED}$: equal to or greater than 0.1 µA and equal to or smaller than 100 µA
Area $S_{sub}$ of first major surface 103 of substrate 102: equal to or greater than 40,000 µm² and equal to or smaller than 250,000 µm²

Luminescent area $S_{lumi}$ of light emitting layer 107: equal to or greater than 400 µm² and equal to or smaller than 62,500 µm²

Area ratio $S_{lumi}/S_{sub}$: equal to or greater than 0.0016 and equal to or smaller than 0.25

Current density of light emitting layer 107: equal to or greater than 0.1 A/cm² and equal to or smaller than 1 A/cm²

Fifth Setting Example

Operating current $I_{LED}$: equal to or greater than 1 µA and equal to or smaller than 15 µA Area $S_{sub}$ of first major surface 103 of substrate 102: equal to or greater than 40,000 µm² and equal to or smaller than 250,000 µm²

Luminescent area $S_{lumi}$ of light emitting layer 107: equal to or greater than 400 µm² and equal to or smaller than 62,500 µm²

Area ratio $S_{lumi}/S_{sub}$: equal to or greater than 0.0016 and equal to or smaller than 0.25

Current density of light emitting layer 107: equal to or greater than 0.01 A/cm² and equal to or smaller than 10 A/cm²

Sixth Setting Example

Operating current $I_{LED}$: equal to or greater than 1 µA and equal to or smaller than 15 µA Area $S_{sub}$ of first major surface 103 of substrate 102: equal to or greater than 40,000 µm² and equal to or smaller than 250,000 µm²

Luminescent area $S_{lumi}$ of light emitting layer 107: equal to or greater than 400 µm² and equal to or smaller than 62,500 µm²

Area ratio $S_{lumi}/S_{sub}$: equal to or greater than 0.0016 and equal to or smaller than 0.25

Current density of light emitting layer 107: equal to or greater than 0.1 A/cm² and equal to or smaller than 1 A/cm²

As described above, according to the semiconductor light emitting device 101, the mesa structure 110 is formed in the epitaxial layer 109 under conditions in which the operating current $I_{LED}$ is smaller than 1 mA, the operating current $I_{LED}$ is equal to or greater than 0.1 µA and equal to or smaller than 100 µA or the operating current $I_{LED}$ is equal to or greater than 1 µA and equal to or smaller than 15 µA.

In the mesa structure 110, the area ratio $S_{lumi}/S_{sub}$, which is the ratio of the luminescent area $S_{lumi}$ of the light emitting layer 107 with respect to the area $S_{sub}$ of the first major surface 103 of the substrate 102, is set to be equal to or greater than 0.0016 and equal to or smaller than 0.25. The area $S_{sub}$ of the first major surface 103 of the substrate 102 is set to be equal to or greater than 40,000 µm² and equal to or smaller than 250,000 µm². The luminescent area $S_{lumi}$ of the light emitting layer 107 is set to be equal to or greater than 400 µm² and equal to or smaller than 62,500 µm².

The current density of the light emitting layer 107 can thus be increased by the amount of decrease in the area ratio $S_{lumi}/S_{sub}$ compared to applying the operating current $I_{LED}$ of smaller than 1 mA to the sample A2.

Also, according to the semiconductor light emitting device 101, the operating current $I_{LED}$ and the luminescent area $S_{lumi}$ of the light emitting layer 107 are set such that the current density of the light emitting layer 107 is equal to or greater than 0.01 A/cm² and equal to or smaller than 10 A/cm², or equal to or greater than 0.1 A/cm² and equal to or smaller than 1 A/cm².

As shown in FIG. 16, the optical output and the luminous efficiency of the light emitting layer 107 can thus be increased. The semiconductor light emitting device 101 capable of increasing optical output and luminous efficiency can thereby be provided.

Also, according to the semiconductor light emitting device 101, the light emitting layer 107 having the small luminescent area $S_{lumi}$ can be formed without changing the area $S_{sub}$ of the first major surface 103 of the substrate 102. A reduction of the substrate 102 in accordance with a reduction of the luminescent area $S_{lumi}$ of the light emitting layer 107 can thus be avoided. The semiconductor light emitting device 101 capable of improving handling convenience, optical output and luminous efficiency can thus be provided.

Also, according to the semiconductor light emitting device 101, an area $S_{mesa}$ of a region surrounded by the perimeter edge of the mesa structure 110 can also be reduced as the reduction of the luminescent area $S_{lumi}$ of the light emitting layer 107. The outside region 111 outside the mesa structure 110 can thus be effectively utilized.

More specifically, both the first external terminal 129 and the second external terminal 130 can be formed in regions that do not overlap to the mesa structure 110, in the planar view. Also, both the first pad portion 123 to which the first external terminal 129 is connected and the second pad portion 124 to which the second external terminal 130 is connected, can be formed in regions that do not overlap to the mesa structure 110, in the planar view.

According to such a structure, a blockage of light generated at the light emitting layer 107 by the first external terminal 129 and the second external terminal 130 can be suppressed. Also, a short circuiting of the first external terminal 129 and the mesa structure 110 can be suppressed. Also, a short circuiting of the second external terminal 130 and the mesa structure 110. The semiconductor light emitting device 101 capable of maintaining satisfactory luminous efficiency for prolonged periods can thus be provided.

The first external terminal 129 includes the first lead-out portion 132 that is led out over the epitaxial layer 109. The second external terminal 130 includes the second lead-out portion 134 that is led out over the epitaxial layer 109. A mounting area of the first external terminal 129 and a mounting area of the second external terminal 130 can thus be increased without hindrance.

According to the semiconductor light emitting device 101, the lead-out portion 125 of the second wiring electrode 122 is formed on the first light reflecting layer 118 so as to expose the inner portion of the second internal electrode film 115, in the planar view. A blockage of light generated at the light emitting layer 107 by the second wiring electrode 122 can thus be suppressed.

According to the semiconductor light emitting device 101, the first light reflecting layer 118 and the second light reflecting layer 126 are formed on the epitaxial layer 109. Light is extracted from a region of the first major surface 103 side of the substrate 102 with respect to the light emitting layer 107, in the semiconductor light emitting device 101. According to such a structure, the semiconductor light emitting device 101 having a mounted state shown in FIG. 17 can be provided.

Figure 17:
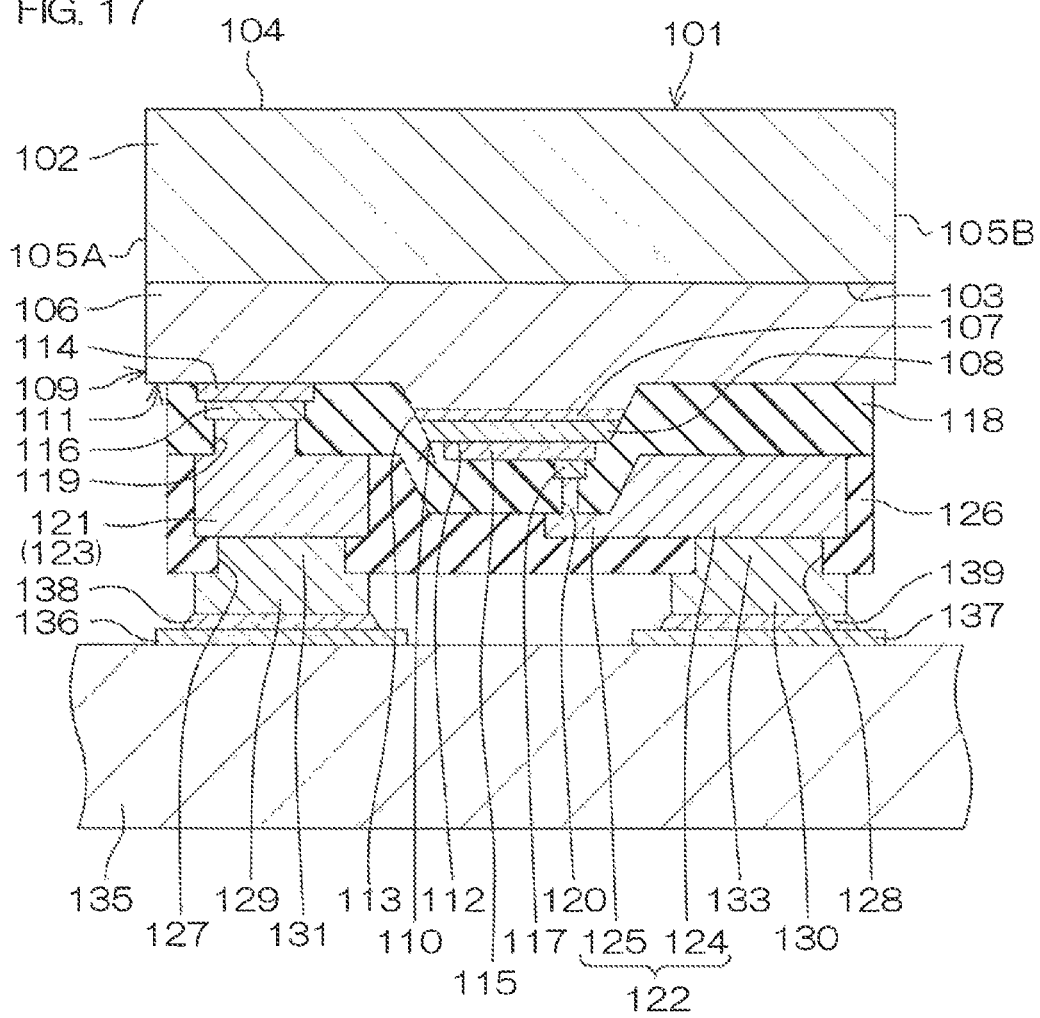
FIG. 17 is a cross-sectional view showing a mounted state of the semiconductor light emitting device shown in FIG. 12.

FIG. 17 is a cross-sectional view showing a mounted state of the semiconductor light emitting device 101 shown in FIG. 12.

Referring to FIG. 17, the semiconductor light emitting device 101 is mounted on a mounting substrate 135 in a state where the first major surface 103 of the substrate 102 is faced to surface of the mounting substrate 135. That is, the semiconductor light emitting device 101 is mounted on the mounting substrate 135 in a face down state.

A first electrode pad 136 and a second electrode pad 137 are formed on the surface of the mounting substrate 135 there are formed at intervals. The first external terminal 129 of the semiconductor light emitting device 101 is connected to the first electrode pad 136 via a conductive bonding material 138. The second external terminal 130 of the semiconductor light emitting device 101 is connected to the second electrode pad 137 via a conductive bonding material 139.

Light generated at the light emitting layer 107 is directly extracted from the second major surface 104 of the substrate 102. Light generated at the light emitting layer 107 is reflected by the first light reflecting layer 118 and the second light reflecting layer 126 toward the substrate 102, and is extracted from the second major surface 104 of the substrate 102. The second major surface 104 of the substrate 102 is therefore formed as a light extraction surface, in the semiconductor light emitting device 101.

The first wiring electrode 121 (first pad portion 123), the second pad portion 124, the first external terminal 129 and the second external terminal 130 are not present in a region on the mesa structure 110 (light emitting layer 107), in the semiconductor light emitting device 101. Also, the lead-out portion 125 of the second wiring electrode 122 is formed on the first light reflecting layer 118 so as to expose the inner portion of the second internal electrode film 115, in the planar view.

A blockage of light generated at the light emitting layer 107 by the electrode layers can thus be suppressed. Light generated at the light emitting layer 107 can thus be satisfactorily reflected by the first light reflecting layer 118 and second light reflecting layer 126. Light can thereby be satisfactorily extracted from the second major surface 104 of the substrate 102.

Figure 18:
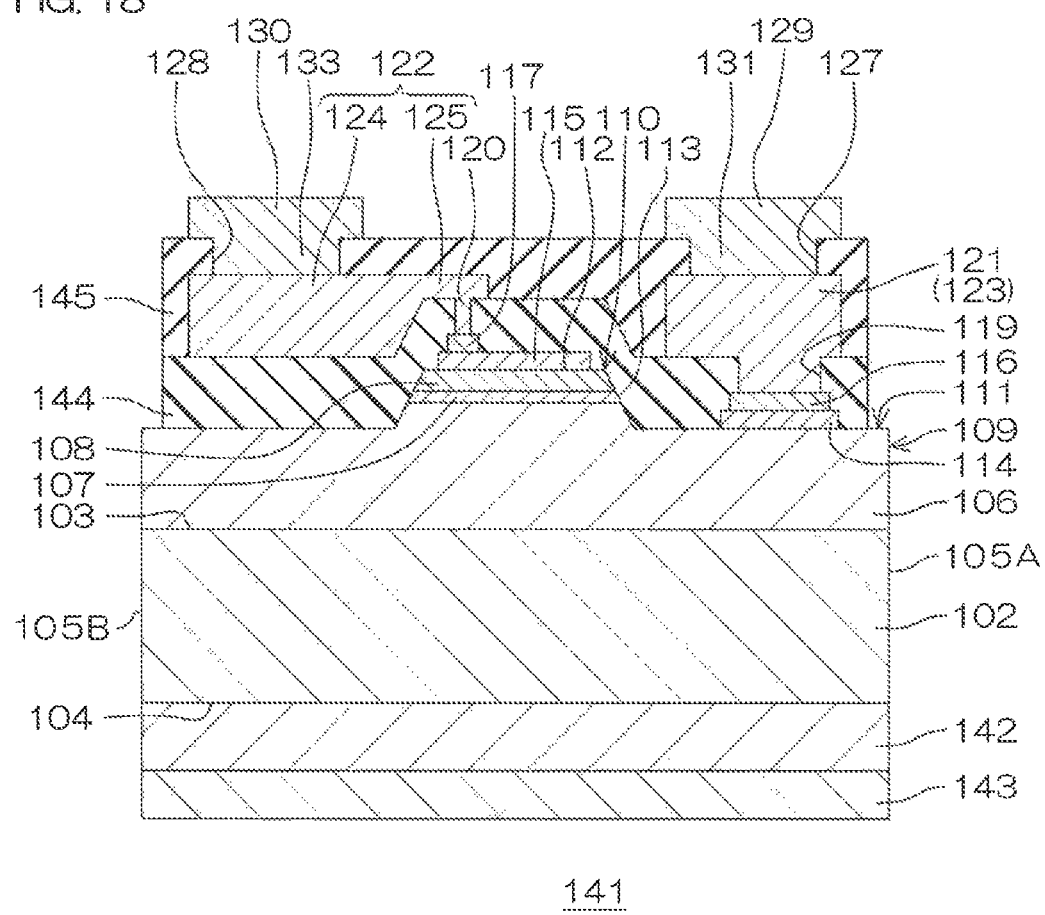
FIG. 18 is a cross-sectional view of a semiconductor light emitting device according to a third preferred embodiment of the present invention.

FIG. 18 is a plan view of a semiconductor light emitting device 141 according to a third preferred embodiment of the present invention. In this preferred embodiment, the same reference numerals will be given to the same arrangements as those described in the second preferred embodiment, and the description thereof will be omitted.

The semiconductor light emitting device 141 includes a laminate structure having a plurality of light reflecting layers laminated on the second major surface 104 side of the substrate 102. The plurality of light reflecting layers include a first light reflecting layer 142 and a second light reflecting layer 143 laminated in that order from the second major surface 104 side of the substrate 102.

The first light reflecting layer 142 covers the second major surface 104 of the substrate 102. The first light reflecting layer 142 is made of an insulating material. The first light reflecting layer 142 includes a DBR layer in this preferred embodiment. The DBR layer has a laminate structure in which a plurality of insulating films having different refractive indexes are alternately laminated by ¼ wavelength optical length.

The DBR layer may be formed by at least two or more insulating materials, such as $ZrO_2$, $Al_2O_3$, $SiO_2$, $TiO_2$, $Ta_2O_5$, $Nb_2O_5$, AlN, SiN, AlON or SiON.

The second light reflecting layer 143 covers the first light reflecting layer 142. The second light reflecting layer 143 is made of a metal material. The second light reflecting layer 143 may have a single-layer structure including Al or Au. The second light reflecting layer 143 may have a laminate structure including Al and/or Au.

The semiconductor light emitting device 141 may have a structure that includes only the first light reflecting layer 142. The semiconductor light emitting device 141 may have a structure that includes only the second light reflecting layer 143. The semiconductor light emitting device 141 may have a laminate structure having the second light reflecting layer 143 and first light reflecting layer 142 laminated in that order from the second major surface 104 side of the substrate 102.

A first light-transmitting layer 144 and a second light-transmitting layer 145 are formed on the epitaxial layer 109, instead of the first light reflecting layer 118 and the second light reflecting layer 126. The first light-transmitting layer 144 is made of an insulating material having a light-transmitting property. The second light-transmitting layer 145 is made of an insulating material having a light-transmitting property.

The first light-transmitting layer 144 may include at least one of $ZrO_2$, $Al_2O_3$, $SiO_2$, $TiO_2$, $Ta_2O_5$, $Nb_2O_5$, AlN, SiN, AlON or SiON. The second light-transmitting layer 145 may include at least one of $ZrO_2$, $Al_2O_3$, $SiO_2$, $TiO_2$, $Ta_2O_5$, $Nb_2O_5$, AlN, SiN, AlON or SiON.

As described above, the semiconductor light emitting device 141 exhibits the same effect as that described above in the second preferred embodiment.

Also, according to the semiconductor light emitting device 141, the first light reflecting layer 142 and the second light reflecting layer 143 are formed on the second major surface 104 side of the substrate 102. Also, the first light-transmitting layer 144 and the second light-transmitting layer 145 are formed on the epitaxial layer 109.

Light can thus be extracted from a region opposite side of the first major surface 103 of the substrate 102 with respect to the light emitting layer 107. According to such a structure, the semiconductor light emitting device 141 that has a mounted state shown in FIG. 19 can be provided.

Figure 19:
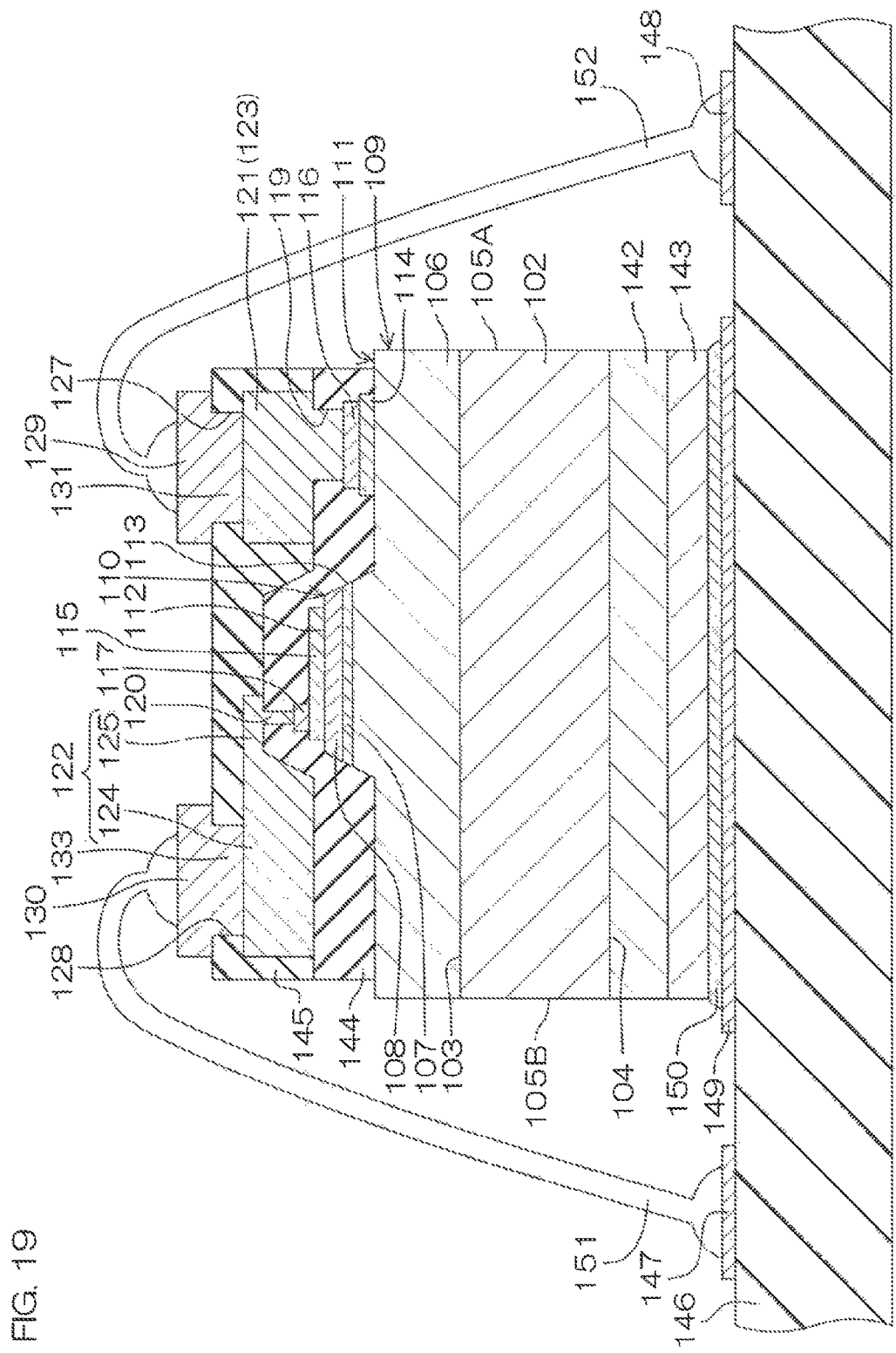
FIG. 19 is a cross-sectional view showing a mounted state of the semiconductor light emitting device shown in FIG. 18.

FIG. 19 is a cross-sectional view showing a mounted state of the semiconductor light emitting device 141 shown in FIG. 18.

Referring to FIG. 19, the semiconductor light emitting device 141 is mounted on a mounting substrate 146 in a state where the second major surface 104 of the substrate 102 is faced to a surface of the mounting substrate 146. That is, the semiconductor light emitting device 141 is mounted on the mounting substrate 146 in a face up state.

A first electrode pad 147 and a second electrode pad 148 are formed on the surface of the mounting substrate 146 at intervals. A die pad 149 to which the semiconductor light emitting device 141 is bonded is formed in a region between the first electrode pad 147 and the second electrode pad 148 on the surface of the mounting substrate 146.

The first external terminal 129 of the semiconductor light emitting device 141 is electrically connected to the first electrode pad 147 via a conductor wire 151. The conductor wire 151 may include a bonding wire.

The second external terminal 130 of the semiconductor light emitting device 141 is electrically connected to the second electrode pad 148 via a conductor wire 152. The conductor wire 152 may include a bonding wire.

The second light reflecting layer 143 of the semiconductor light emitting device 141 is bonded to the die pad 149 via the bonding material 150. The bonding material 150 may include a metal material or an insulating material.

Light generated at the light emitting layer 107 is directly extracted from a surface of the second light-transmitting layer 145. Light generated at the light emitting layer 107 is reflected by the first light reflecting layer 142 and the second light reflecting layer 143 toward the substrate 102, and is extracted from the surface of the second light-transmitting layer 145. The surface of the second light-transmitting layer 145 is therefore formed as a light extraction surface, in the semiconductor light emitting device 141.

The first wiring electrode 121 (first pad portion 123), the second pad portion 124, the first external terminal 129 and the second external terminal 130 are not formed in a region on the mesa structure 110 (light emitting layer 107), in the semiconductor light emitting device 141. Also, the lead-out portion 125 of the second wiring electrode 122 is formed on the first light-transmitting layer 144 so as to expose the inner portion of the second internal electrode film 115, in the planar view.

A blockage of light generated at the light emitting layer 107 by the electrode layers can be suppressed. Light generated at the light emitting layer 107 can thus be satisfactorily reflected by the first light reflecting layer 142 and second light reflecting layer 143. Light can thus be satisfactorily extracted from the surface of the second light-transmitting layer 145.

FIG. 20 is a plan view of a semiconductor light emitting device 161 according to a fourth preferred embodiment of the present invention. In this preferred embodiment, the same reference numerals will be given to the same arrangements as those described in the second preferred embodiment, and the description thereof will be omitted.

A plurality of mesa structures 110 (three in this preferred embodiment) are formed in the epitaxial layer 109, in the semiconductor light emitting device 161. The second internal electrode film 115 and the second electrode film 117 are formed on each mesa structure 110, in the semiconductor light emitting device 161.

The second pad portion 124 of the second wiring electrode 122 is formed in a common pad portion that is electrically connected to each of the mesa structures 110. The lead-out portion 125 of the second wiring electrode 122 is led out toward each mesa structure 110 in a one-to-one relationship.

The second wiring electrode 122 is thus electrically connected to each mesa structure 110. The second external terminal 130 is thereby electrically connected to the second semiconductor layer 108 of each mesa structure 110 via the second wiring electrode 122.

An area ratio $S_{total}/S_{sub}$ is used instead of the area ratio $S_{lumi}/S_{sub}$, in the semiconductor light emitting device 161. The area ratio $S_{total}/S_{sub}$ is a ratio of a total area $S_{total}$ of the light emitting layers 107 with respect to the area $S_{sub}$ of the first major surface 103 of the substrate 102. The total area $S_{total}$ of the light emitting layers 107 is a total of the luminescent area $S_{lumi}$ of each light emitting layer 107.

The area ratio $S_{total}/S_{sub}$ may be set to the same numerical value as the area ratio $S_{lumi}/S_{sub}$. That is, the area ratio $S_{total}/S_{sub}$ may be set to be greater than 0 and equal to or smaller than 0.25 ($0<S_{total}/S_{sub}\leq 0.25$).

As described above, the semiconductor light emitting device 161 also exhibits the same effect as that described above in the second preferred embodiment.

Although the second to fourth preferred embodiments of the present invention have been described above, the second to fourth preferred embodiments may be implemented in yet other modes.

In the second to fourth preferred embodiments, the first light reflecting layer 118 may include an insulating film having a light-transmitting property. The second light reflecting layer 126 may include an insulating film having a light-transmitting property. In such a structure, a location where light is reflected may be changed by forming the second internal electrode film 115 including a metal material having a light-reflecting property, such as Al or Ag.

In the second to third preferred embodiments, an area ratio $S_{mesa}/S_{sub}$ may be used instead of the area ratio $S_{lumi}/S_{sub}$. The area ratio $S_{mesa}/S_{sub}$ is a ratio of an area $S_{mesa}$ of the mesa structure 110 with respect to the area $S_{sub}$ of the first major surface 103 of the substrate 102. The area $S_{mesa}$ of the mesa structure 110 is an area of a region surrounded by the outer perimeter edge of the mesa structure 110.

The area ratio $S_{mesa}/S_{sub}$ may be set to the same numerical value as the area ratio $S_{lumi}/S_{sub}$. That is, the area ratio $S_{mesa}/S_{sub}$ may be set to be greater than 0 and equal to or smaller than 0.25 ($0<S_{mesa}/S_{sub}\leq 0.25$).

In the fourth preferred embodiment, an area ratio $S_{mtotal}/S_{sub}$ may be used instead of the area ratio $S_{total}/S_{sub}$. The area ratio $S_{mtotal}/S_{sub}$ is a ratio of a total area $S_{mtotal}$ of the mesa structure 110 with respect to the area $S_{sub}$ of the first major surface 103 of the substrate 102. The total area $S_{mtotal}$ of the mesa structure 110 is a total of the area $S_{mesa}$ of each mesa structure 110. The area $S_{mesa}$ of each mesa structure 110 is an area of a region surrounded by the outer perimeter edge of each mesa structure 110.

The area ratio $S_{mtotal}/S_{sub}$ may be set to the same numerical value as the area ratio $S_{total}/S_{sub}$. That is, the area ratio $S_{mtotal}/S_{sub}$ may be set to be greater than 0 and equal to or smaller than 0.25 ($0<S_{mtotal}/S_{sub}\leq 0.25$).

In the second to fourth preferred embodiments, either or both the first external terminal 129 and second external terminal 130 may be formed in a region that does not overlap to the light emitting layer 107, in the planar view. In this structure, the mesa structure 110 (light emitting layer 107) and either or both the first external terminal 129 and the second external terminal 130 do not overlap in an up-down direction.

A short circuiting between the mesa structure 110 (light emitting layer 107) and either or both the first external terminal 129 and the second external terminal 130 can thus be suppressed. The semiconductor light emitting device 101 capable of maintaining satisfactory luminous efficiency for prolonged periods can thereby be provided.

In particular, a structure where the second external terminal 130 does not overlap to the second semiconductor layer 108 forming an upper portion of the mesa structure 110 (light emitting layer 107) in the planar view is a structure obtained by reducing the luminescent area $S_{lumi}$ of the light emitting layer 107 (the area $S_{mesa}$ of the mesa structure 110). Such a structure is effective for suppressing a short circuiting.

In the second to fourth preferred embodiments, the mesa structure 110 (light emitting layer 107) may be formed in a circular shape in the planar view or an ellipsoid shape in the planar view. The mesa structure 110 (light emitting layer 107) may be formed in a polygonal shape in the planar view, such as a rectangular shape in the planar view, a triangular shape in the planar view or a hexagonal shape in the planar view.

In the second to fourth preferred embodiments, lateral surfaces of the mesa structure 110 may rise in the direction perpendicular to the surface of the outside region 111.

In the second to fourth preferred embodiments, a structure where the conductive type of each semiconductor portion is inverted may be employed. That is, the p-type portion may be inverted to the n-type portion, and the n-type portion may be inverted to the p-type portion. Therefore, the epitaxial layer 109 may include a p-type first semiconductor layer 106 laminated on the first major surface 103 of the substrate 102, a light emitting layer 107 laminated on the p-type first semiconductor layer 106, and an n-type second semiconductor layer 108 laminated on the light emitting layer 107.

Examples of features extracted from this specification and/or the drawings are shown below.

[A1] A semiconductor light emitting device including a substrate having a first major surface and a second major surface, a semiconductor layer that includes a first semiconductor layer of a first conductive type formed on the first major surface of the substrate, a light emitting layer formed on the first semiconductor layer and a second semiconductor layer of a second conductive type formed on the light emitting layer, a first external terminal electrically connected to the first semiconductor layer, and a second external terminal electrically connected to the second semiconductor layer, wherein either or both the first external terminal and the second external terminal are formed in a region that does not overlap to the light emitting layer, in plan view.

According to the semiconductor light emitting device, a blockage of light generated at the light emitting layer by either or both the first external terminal and the second external terminal can be suppressed. Also, a short circuiting between the light emitting layer and either or both the first external terminal and the second external terminal can be suppressed. The semiconductor light emitting device capable of maintaining satisfactory luminous efficiency for prolonged periods can thus be provided.

[A2] The semiconductor light emitting device according to A1, wherein the light emitting layer has a luminescent area smaller than an area of the first major surface of the substrate, in plan view.

According to this semiconductor light emitting device, a current density of the light emitting layer can be increased. The semiconductor light emitting device capable of maintaining satisfactory luminous efficiency for prolonged periods can thus be provided.

[A3] The semiconductor light emitting device according to A1 or A2, wherein the second external terminal is formed in a region that does not overlap to the light emitting layer, in plan view.

[A4] The semiconductor light emitting device according to any one of A1 to A3, wherein both the first external terminal and the second external terminal are formed in a region that does not overlap to the light emitting layer, in plan view.

[A5] The semiconductor light emitting device according to any one of A1 to A4, wherein the first external terminal and the second external terminal are formed so as to sandwich the light emitting layer, in plan view.

[A6] The semiconductor light emitting device according to any one of A1 to A5 further including a light reflecting layer that covers the second semiconductor layer.

[A7] The semiconductor light emitting device according to any one of A1 to A5 further including a light reflecting layer that covers the second major surface of the substrate.

[A8] The semiconductor light emitting device according to any one of A1 to A7, wherein an area of the first major surface of the substrate is equal to or greater than 40,000 $\mu m^2$ and equal to or smaller than 250,000 $\mu m^2$.

[A9] The semiconductor light emitting device according to any one of A1 to A8, wherein an luminescent area of the light emitting layer is equal to or greater than 400 $\mu m^2$ and equal to or smaller than 62,500 $\mu m^2$.

[A10] The semiconductor light emitting device according to any one of A1 to A9, wherein a current density of the light emitting layer is equal to or greater than 0.01 A/cm$^2$ and equal to or smaller than 10 A/cm$^2$.

[A11] The semiconductor light emitting device according to any one of A1 to A10, wherein a current density of the light emitting layer is equal to or greater than 0.1 A/cm$^2$ and equal to or smaller than 1 A/cm$^2$.

[A12] The semiconductor light emitting device according to any one of A1 to A11, wherein an operating current supplied to the semiconductor layer is smaller than 1 mA.

[A13] The semiconductor light emitting device according to any one of A1 to A12, wherein an operating current supplied to the semiconductor layer is equal to or greater than 0.1 µA and equal to or smaller than 100 µA.

[A14] The semiconductor light emitting device according to any one of A1 to A13, wherein an operating current supplied to the semiconductor layer is equal to or greater than 1 µA and equal to or smaller than 15 µA.

[A15] The semiconductor light emitting device including a substrate having a first major surface and a second major surface, a semiconductor layer that includes a first semiconductor layer of a first conductive type formed on the first major surface of the substrate, a light emitting layer formed on the first semiconductor layer and a second semiconductor layer of a second conductive type formed on the light emitting layer, a mesa structure formed in the semiconductor layer by selectively notching the first semiconductor layer, the light emitting layer and the second semiconductor layer so as to expose the first semiconductor layer is exposed, a first external terminal electrically connected to the first semiconductor layer, and a second external terminal electrically connected to the second semiconductor layer, wherein either or both the first external terminal and the second external terminal are formed in a region that does not overlap to the mesa structure, in plan view.

According to this semiconductor light emitting device, a blockage of light generated at the light emitting layer by either or both the first external terminal and the second external terminal can be suppressed. Also, a short circuiting between the mesa structure and either or both the first external terminal and the second external terminal can be suppressed. The semiconductor light emitting device capable of maintaining satisfactory luminous efficiency for prolonged periods can thus be provided.

[A16] The semiconductor light emitting device according to A15, wherein the mesa structure has a luminescent area smaller than an area of the first major surface of the substrate, in plan view.

[A17] The semiconductor light emitting device according to A15 or A16, wherein the second external terminal is formed in a region that does not overlap to the mesa structure, in plan view.

[A18] The semiconductor light emitting device according to any one of A15 to A17, wherein both the first external terminal and second external terminal are formed in regions that do not overlap to the mesa structure, in plan view.

[B1] A semiconductor light emitting device including a substrate having a first major surface and a second major surface, a semiconductor layer that includes a first semiconductor layer of a first conductive type formed on the first major surface of the substrate, a light emitting layer formed on the first semiconductor layer and a second semiconductor layer of a second conductive type formed on the light emitting layer, and a plurality of mesa structures formed in the semiconductor layer by selectively notching the first semiconductor layer, the light emitting layer and the second semiconductor layer, so as to expose the first semiconductor layer.

According to a semiconductor light emitting device, the plurality of mesa structures are formed in the semiconductor layer. A ratio of a luminescent area of each light emitting layer with respect to an area of the first major surface of the substrate, in plan view, can be reduced. A density of current flowing through each light emitting layer can thereby be increased. A luminous efficiency can thereby be increased.

[B2] The semiconductor light emitting device according to B1, wherein a ratio of a total area of the light emitting layers with respect to an area of the first major surface of the substrate is equal to or smaller than 0.25.

[B3] The semiconductor light emitting device according to B1 or B2, wherein an area of the first major surface of the substrate is equal to or greater than 40,000 $\mu m^2$ and equal to or smaller than 250,000 $\mu m^2$.

[B4] The semiconductor light emitting device according to any one of B1 to B3, wherein a total area of the light emitting layer is equal to or greater than 400 $\mu m^2$ and equal to or smaller than 62,500 $\mu m^2$.

[B5] The semiconductor light emitting device according to any one of B1 to B4, wherein a ratio of a total area of the mesa structures with respect to an area of the first major surface of the substrate is equal to or smaller than 0.25.

[B6] The semiconductor light emitting device according to any one of B1 to B5, wherein a total current density of the light emitting layer is equal to or greater than 0.01 $A/cm^2$ and equal to or smaller than 10 $A/cm^2$.

[B7] The semiconductor light emitting device according to any one of B1 to B6, wherein a total current density of the light emitting layer is equal to or greater than 0.1 $A/cm^2$ and equal to or smaller than 1 $A/cm^2$.

[B8] The semiconductor light emitting device according to any one of B1 to B7, wherein the plurality of mesa structures are arranged in a moth-eye structure or in a matrix pattern.

[B9] The semiconductor light emitting device according to any one of B1 to B8, wherein each mesa structure is formed in a circular shape in plan view or in a polygonal shape in plan view.

[B10] The semiconductor light emitting device according to any one of B1 to B9 further including a first external terminal electrically connected to the first semiconductor layer and a second external terminal electrically connected to the second semiconductor layer.

[B11] The semiconductor light emitting device according to B10, wherein a mesa structure forming region in which a plurality of mesa structures are formed, and an outside region that exposes the first semiconductor layer at a region outside the mesa structure forming region, in the semiconductor layer, the first external terminal being electrically connected to the first semiconductor layer in the outside region, and the second external terminal being electrically connected to the second semiconductor layer in the mesa structure forming region.

[B12] The semiconductor light emitting device according to B11 further including a wiring film interposed in a region between the second external terminal and the second semiconductor layer.

[B13] The semiconductor light emitting device according to B12, wherein the wiring film covers a whole area of the mesa structure forming region.

[B14] The semiconductor light emitting device according to any one of B10 to B13 further including an electrode film interposed in a region between the first external terminal and the first semiconductor layer.

[B15] The semiconductor light emitting device according to B14, wherein the outside region extends along a perimeter edge of the mesa structure forming region, and the electrode film extends along a perimeter edge of the mesa structure forming region.

[B16] The semiconductor light emitting device according to B14 or B15, wherein the outside region surrounds the mesa structure forming region, and the electrode film surrounds the mesa structure forming region.

[B17] The semiconductor light emitting device according to any one of B1 to B16 further including a light reflecting layer that covers the plurality of mesa structures.

[B18] The semiconductor light emitting device according to B17, wherein each mesa structure has an inclined portion inclined downward from the second semiconductor layer toward the first semiconductor layer, and the light reflecting layer covers the inclined portion of each mesa structure.

[B19] The semiconductor light emitting device according to B17 or B18, wherein the light reflecting layer includes a metal film.

[B20] The semiconductor light emitting device according to B17 or B18, wherein the light reflecting layer includes an insulating film.

[B21] The semiconductor light emitting device according to B17 or B18, wherein the light reflecting layer has a laminate structure in which a plurality of insulating films having different refractive indexes are laminated.

[B22] The semiconductor light emitting device according to any one of B1 to B21, wherein the substrate has a light-transmitting property.

[B23] The semiconductor light emitting device according to any one of B1 to B22, wherein an operating current supplied to the semiconductor layer is smaller than 1 mA.

[B24] The semiconductor light emitting device according to any one of B1 to B23, wherein an operating current supplied to the semiconductor layer is equal to or greater than 0.1 $\mu A$ and equal to or smaller than 100 $\mu A$.

[B25] The semiconductor light emitting device according to any one of B1 to B24, wherein an operating current supplied to the semiconductor layer is equal to or greater than 1 $\mu A$ and equal to or smaller than 15 $\mu A$.

The present application corresponds to Japanese Patent Application No. 2016-94837 filed at the Japan Patent Office on May 10, 2016, Japanese Patent Application No. 2016-105573 filed at the Japan Patent Office on May 26, 2016, and Japanese Patent Application No. 2017-88714 filed at the Japan Patent Office on Apr. 27, 2017, the entire contents of these applications being incorporated herein by reference.

Although the preferred embodiments of the present invention have been described in detail above, these embodiments are merely specific examples to clarify the technical contents of the present invention, and the present invention should not be interpreted as being limited only to these specific examples, the scope of the present invention being limited only by the appended claims.

What is claimed is:

1. A semiconductor light emitting device comprising:
   a substrate having a first major surface and a second major surface;
   a laminate semiconductor layer that includes a first semiconductor layer of a first conductive type formed on the first major surface of the substrate, a light emitting layer formed on the first semiconductor layer and a second semiconductor layer of a second conductive type formed on the light emitting layer; and
   a mesa structure formed in the laminate semiconductor layer by selectively notching the first semiconductor layer, the light emitting layer and the second semiconductor layer so as to expose the first semiconductor layer, and a ratio of a luminescent area of the light emitting layer with respect to an area of the first major surface of the substrate being set to equal to or smaller than 0.25.

2. The semiconductor light emitting device according to claim 1, wherein a plurality of the mesa structures are formed in the laminate semiconductor layer.

3. The semiconductor light emitting device according to claim 2, wherein a ratio of a total area of the light emitting layers with respect to the area of the first major surface of the substrate is equal to or smaller than 0.25.

4. The semiconductor light emitting device according to claim 3, wherein the area of the first major surface of the substrate is equal to or greater than 40,000 $\mu m^2$ and equal to or smaller than 250,000 $\mu m^2$.

5. The semiconductor light emitting device according to claim 3, wherein the total area of the light emitting layer is equal to or greater than 400 $\mu m^2$ and equal to or smaller than 62,500 $\mu m^2$.

6. The semiconductor light emitting device according to claim 2, wherein a ratio of a total area of the mesa structures with respect to the area of the first major surface of the substrate is equal to or smaller than 0.25.

7. The semiconductor light emitting device according to claim 2, wherein a total current density of the light emitting layers is equal to or greater than 0.01 A/$cm^2$ and equal to or smaller than 10 A/$cm^2$.

8. The semiconductor light emitting device according to claim 2, wherein a total current density of the light emitting layers is equal to or greater than 0.1 A/$cm^2$ and equal to or smaller than 1 A/$cm^2$.

9. The semiconductor light emitting device according to claim 2, wherein the plurality of mesa structures are arranged in a moth-eye structure or in a matrix pattern.

10. The semiconductor light emitting device according to claim 1, wherein the mesa structure is formed in a circular shape in plan view or in a polygonal shape in plan view.

11. The semiconductor light emitting device according to claim 1 further comprising:
a first external terminal electrically connected to the first semiconductor layer; and
a second external terminal electrically connected to the second semiconductor layer.

12. The semiconductor light emitting device according to claim 11, wherein a mesa structure forming region where the mesa structure is formed, and an outside region that exposes the first semiconductor layer at a region outside the mesa structure forming region are set in the laminate semiconductor layer,
the first external terminal is electrically connected to the first semiconductor layer in the outside region, and
the second external terminal is electrically connected to the second semiconductor layer in the mesa structure forming region.

13. The semiconductor light emitting device according to claim 12 further comprising:
a wiring film interposed in a region between the second external terminal and the second semiconductor layer.

14. The semiconductor light emitting device according to claim 13, wherein the wiring film covers a whole area of the mesa structure forming region.

15. The semiconductor light emitting device according to claim 12 further comprising:
an electrode film interposed in a region between the first external terminal and the first semiconductor layer.

16. The semiconductor light emitting device according to claim 15, wherein the outside region extends along a perimeter edge of the mesa structure forming region, and
the electrode film extends along the perimeter edge of the mesa structure forming region.

17. The semiconductor light emitting device according to claim 15, wherein the outside region surrounds the mesa structure forming region, and
the electrode film surrounds the mesa structure forming region.

18. The semiconductor light emitting device according to claim 1 further comprising:
a light reflecting layer that covers the mesa structure.

19. The semiconductor light emitting device according to claim 18, wherein the mesa structure has an inclined portion inclined downward from the second semiconductor layer toward the first semiconductor layer, and
the light reflecting layer covers the inclined portion of the mesa structure.

20. The semiconductor light emitting device according to claim 18, wherein the light reflecting layer includes a metal film.

21. The semiconductor light emitting device according to claim 18, wherein the light reflecting layer includes an insulating film.

22. The semiconductor light emitting device according to claim 18, wherein the light reflecting layer has a laminate structure in which a plurality of insulating films having different refractive indexes are laminated.

23. The semiconductor light emitting device according to claim 1, wherein the ratio of the luminescent area of the light emitting layer with respect to the area of the first major surface of the substrate is set to be equal to or greater than 0.0016.

24. The semiconductor light emitting device according to claim 23, wherein the area of the first major surface of the substrate is equal to or greater than 40,000 $\mu m^2$ and equal to or smaller than 250,000 $\mu m^2$.

25. The semiconductor light emitting device according to claim 23, wherein a current density of the light emitting layer is equal to or greater than 0.01 A/$cm^2$ and equal to or smaller than 10 A/$cm^2$.

26. The semiconductor light emitting device according to claim 23, wherein a current density of the light emitting layer is equal to or greater than 0.1 A/$cm^2$ and equal to or smaller than 1 A/$cm^2$.

27. The semiconductor light emitting device according to claim 23, wherein a ratio of the area of the mesa structure with respect to the area of the first major surface of the substrate is equal to or smaller than 0.25.

28. The semiconductor light emitting device according to claim 23 further comprising:
a first external terminal electrically connected to the first semiconductor layer, and
a second external terminal electrically connected to the second semiconductor layer.

29. The semiconductor light emitting device according to claim 28, wherein at least one of the first external terminal and the second external terminal is formed in a region that does not overlap the light emitting layer in plan view.

30. The semiconductor light emitting device according to claim 28, wherein the second external terminal is formed in a region that does not overlap the light emitting layer in plan view.

31. The semiconductor light emitting device according to claim 28, wherein both the first external terminal and the second external terminal are formed in regions that do not overlap the light emitting layer in plan view.

32. The semiconductor light emitting device according to claim 28, wherein the first external terminal and the second external terminal are formed so as to sandwich the light emitting layer in plan view.

33. The semiconductor light emitting device according to claim 23 further comprising:
a light reflecting layer that covers the mesa structure.

34. The semiconductor light emitting device according to claim 23 further comprising:
a light reflecting layer that covers the second major surface of the substrate.

35. The semiconductor light emitting device according to claim 33, wherein the light reflecting layer includes a metal film.

36. The semiconductor light emitting device according to claim 33, wherein the light reflecting layer includes an insulating film.

37. The semiconductor light emitting device according to claim 33, wherein the light reflecting layer has a laminate structure in which a plurality of insulating films having different refractive indexes are laminated.

38. The semiconductor light emitting device according to claim 1, wherein the substrate has a light-transmitting property.

39. The semiconductor light emitting device according to claim 1, wherein an operating current supplied to the laminate semiconductor layer is smaller than 1 mA.

40. The semiconductor light emitting device according to claim 1, wherein an operating current supplied to the laminate semiconductor layer is equal to or greater than 0.1 µA and equal to or smaller than 100 µA.

41. The semiconductor light emitting device according to claim 1, wherein an operating current supplied to the laminate semiconductor layer is equal to or greater than 1 µA and equal to or smaller than 15 µA.

* * * * *